United States Patent [19]

Selph et al.

[11] Patent Number: 4,804,957

[45] Date of Patent: Feb. 14, 1989

[54] UTILITY METER AND SUBMETERING SYSTEM

[75] Inventors: Marvin P. Selph; Derek B. Hughes, both of Albuquerque, N. Mex.

[73] Assignee: Triad Communications, Inc., Albuquerque, N. Mex.

[21] Appl. No.: 908,249

[22] Filed: Sep. 17, 1986

Related U.S. Application Data

[63] Continuation-in-part of Ser. No. 802,452, Nov. 27, 1985, abandoned.

[51] Int. Cl.[4] .................... G08C 15/06; G08C 19/20
[52] U.S. Cl. ............................... 340/870.03; 379/107
[58] Field of Search ............... 340/870.02, 870.03, 340/541, 577; 324/103 R, 116, 142; 379/106, 107

[56] References Cited

U.S. PATENT DOCUMENTS

| | | | |
|---|---|---|---|
| 3,388,388 | 6/1968 | Brown | 340/870.02 |
| 3,531,771 | 9/1970 | Jaxheimer et al. | 340/870.03 |
| 4,218,737 | 8/1980 | Buscher et al. | 340/870.03 |
| 4,504,831 | 3/1985 | Jahr et al. | 340/870.02 |
| 4,628,313 | 12/1986 | Gombrich et al. | 340/870.02 |
| 4,701,858 | 10/1987 | Stokes et al. | 340/870.02 |

OTHER PUBLICATIONS

"Centralized Load Control & Auto. Meter Read. Syst. for Dist. Line", Third International Conference on Metering, . . . , London, England, Nov. 15–17, 1977.
"Telephone Meter Reading is Possible" and "Get Meter Readings into Computers Quickly", The American City, Oct. 1972.
"Meter Readers Don't Stop Here Anymore", The American City & Country, Dec. 1975.

Primary Examiner—John W. Caldwell, Sr.
Assistant Examiner—Tyrone Queen
Attorney, Agent, or Firm—Harness, Dickey & Pierce

[57] ABSTRACT

The utility meter is a microprocessor-based circuit using Hall effect electric current sensors to measure power usage by residential and commercial customers. An analog signal from the Hall effect sensor is converted to a digital signal which is fed to the microprocessor for analysis and storage in random access memory. Using a real time clock, the microprocess or determines time of use information which is also stored in random access memory. The memory may be remotely interrogated via a telephone line or serial communication link. If desired, the meter can receive utility usage inputs from other utility meters, such as water, gas, etc. and to fire and intrusion alarms. To effect a submetering configuration useful in apartment complexes, institutional and manufacturing applications, a mutiplicity of meters are multiplexed to a data collection computer which is in turn networked with other data collection computers to a central billing computer.

10 Claims, 17 Drawing Sheets

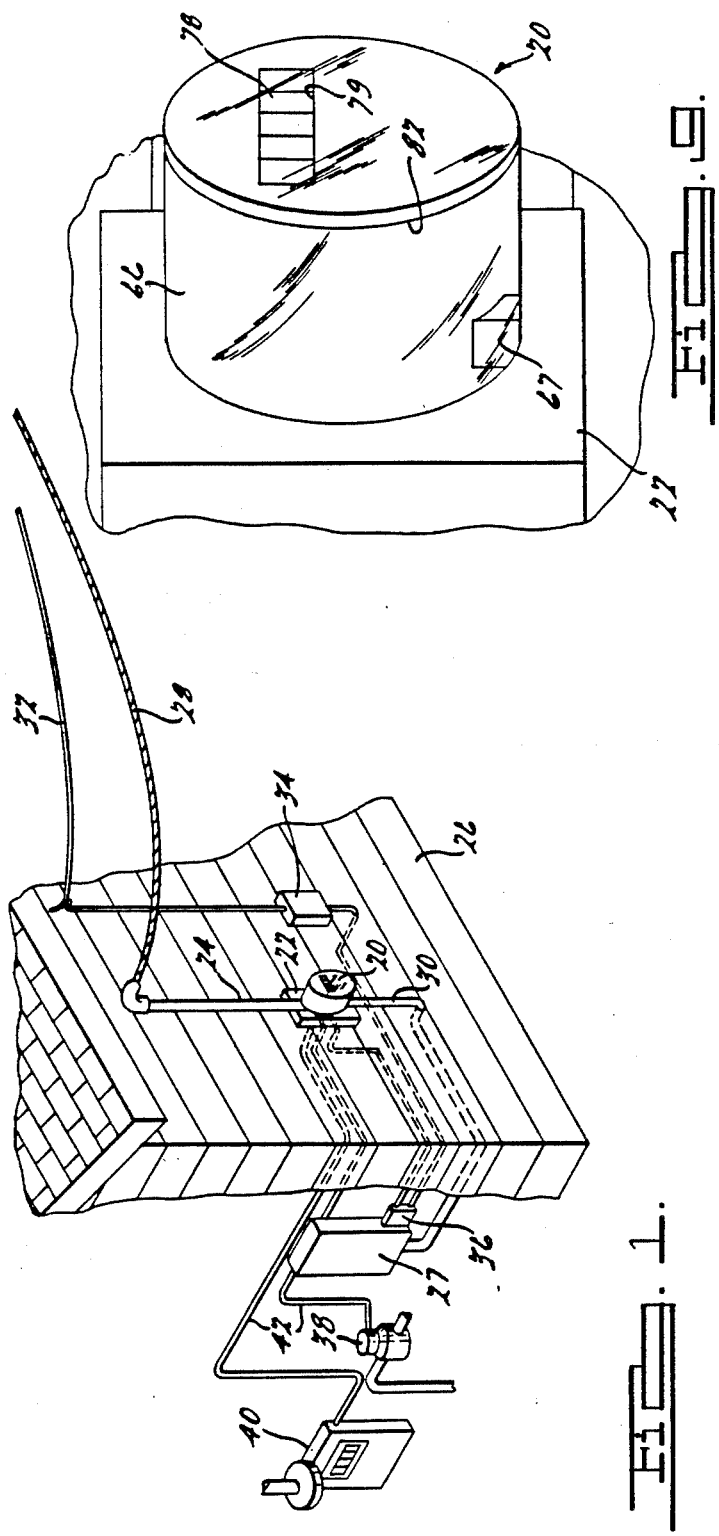
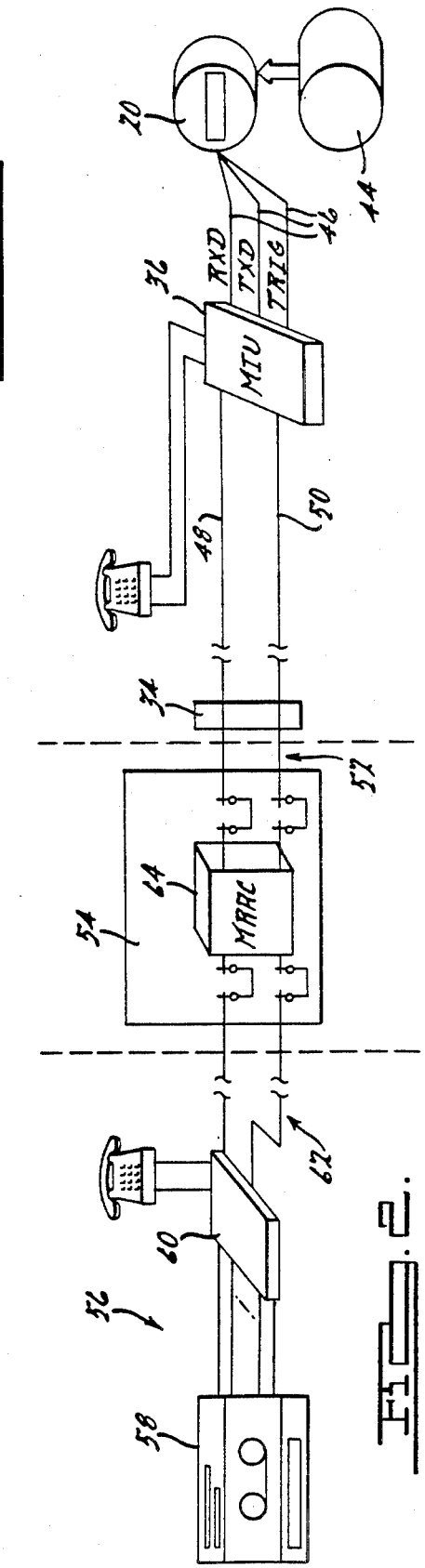
Fig. 1.
Fig. 2.
Fig. 9.

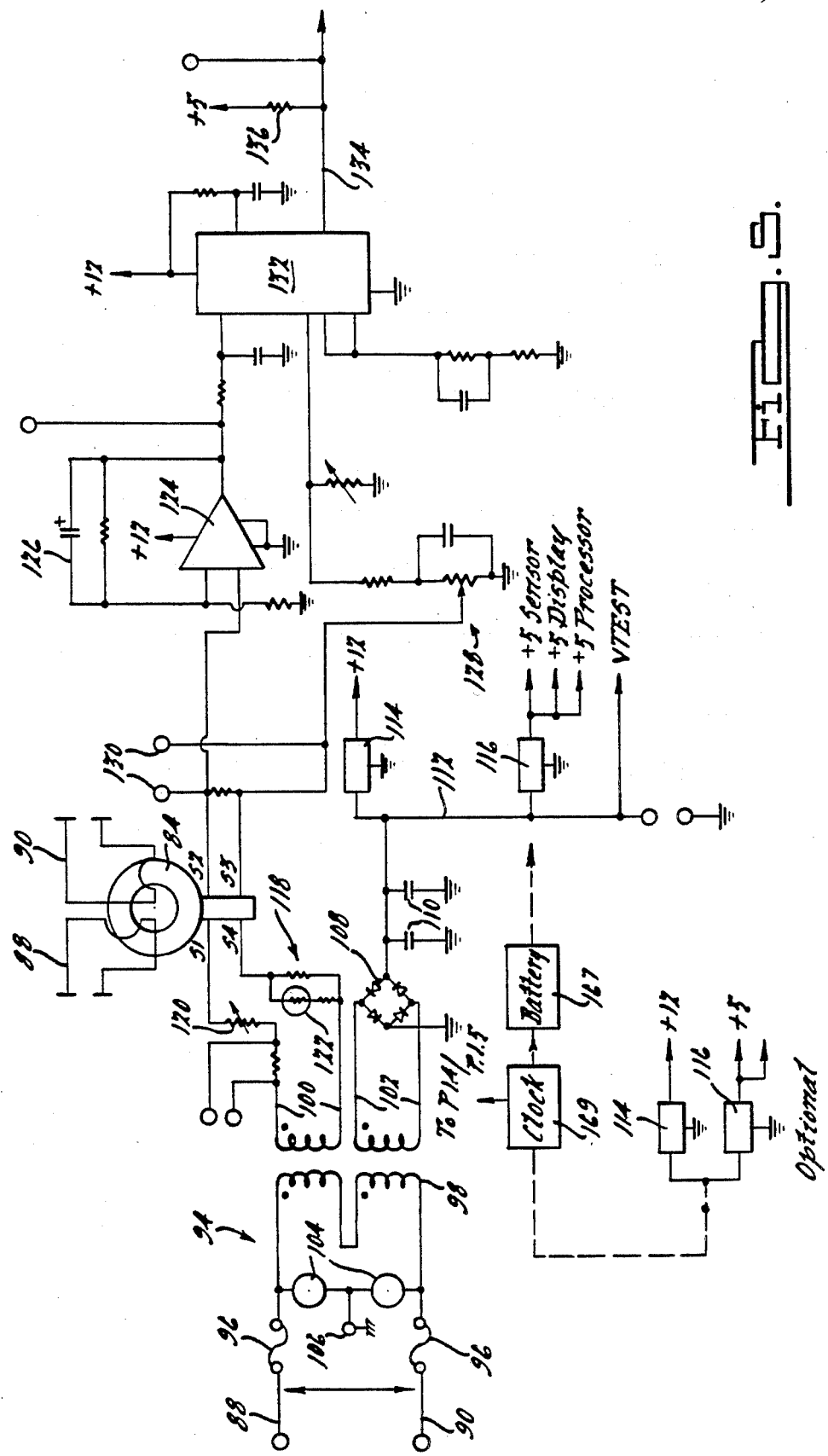

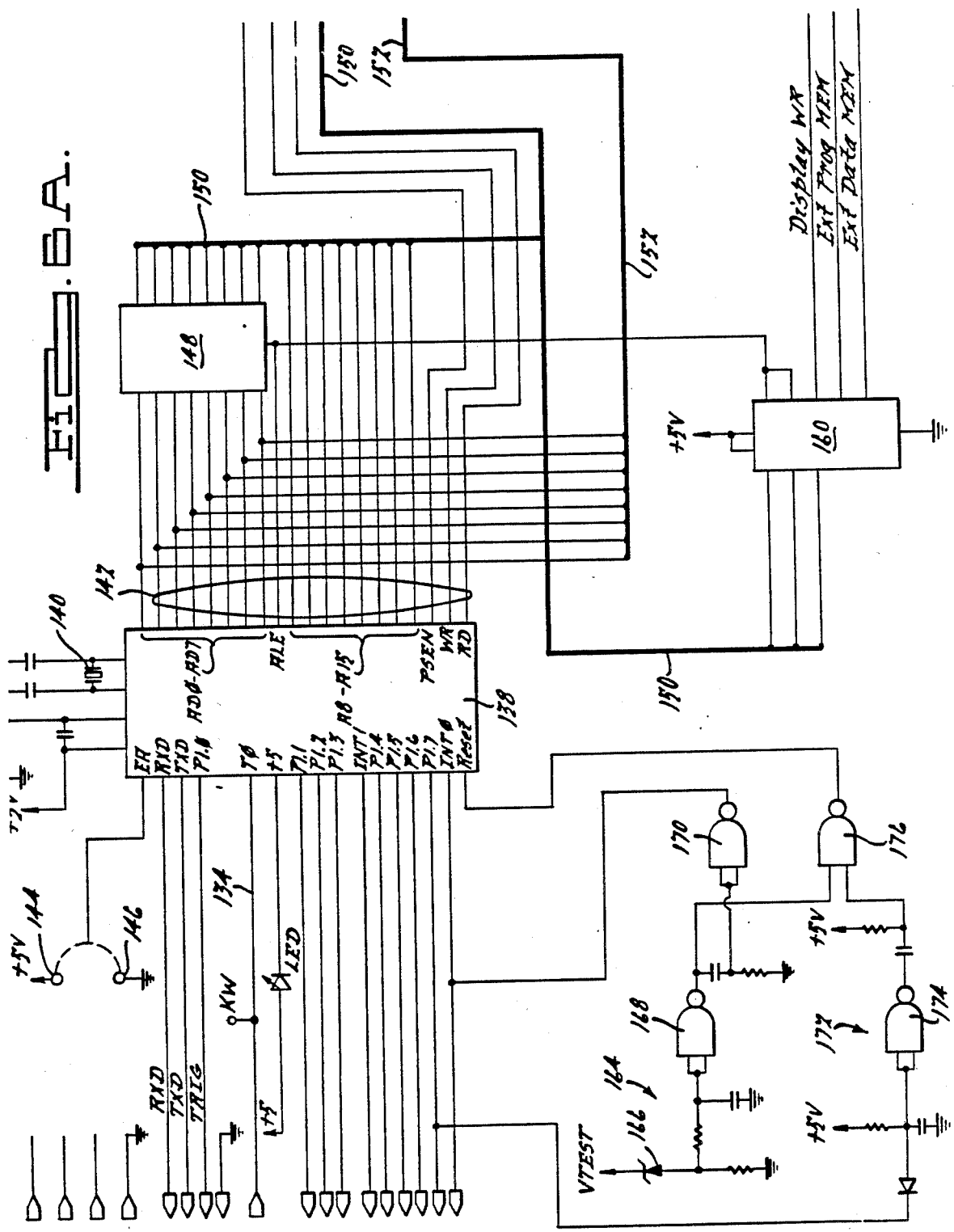
FIG. 6.A.

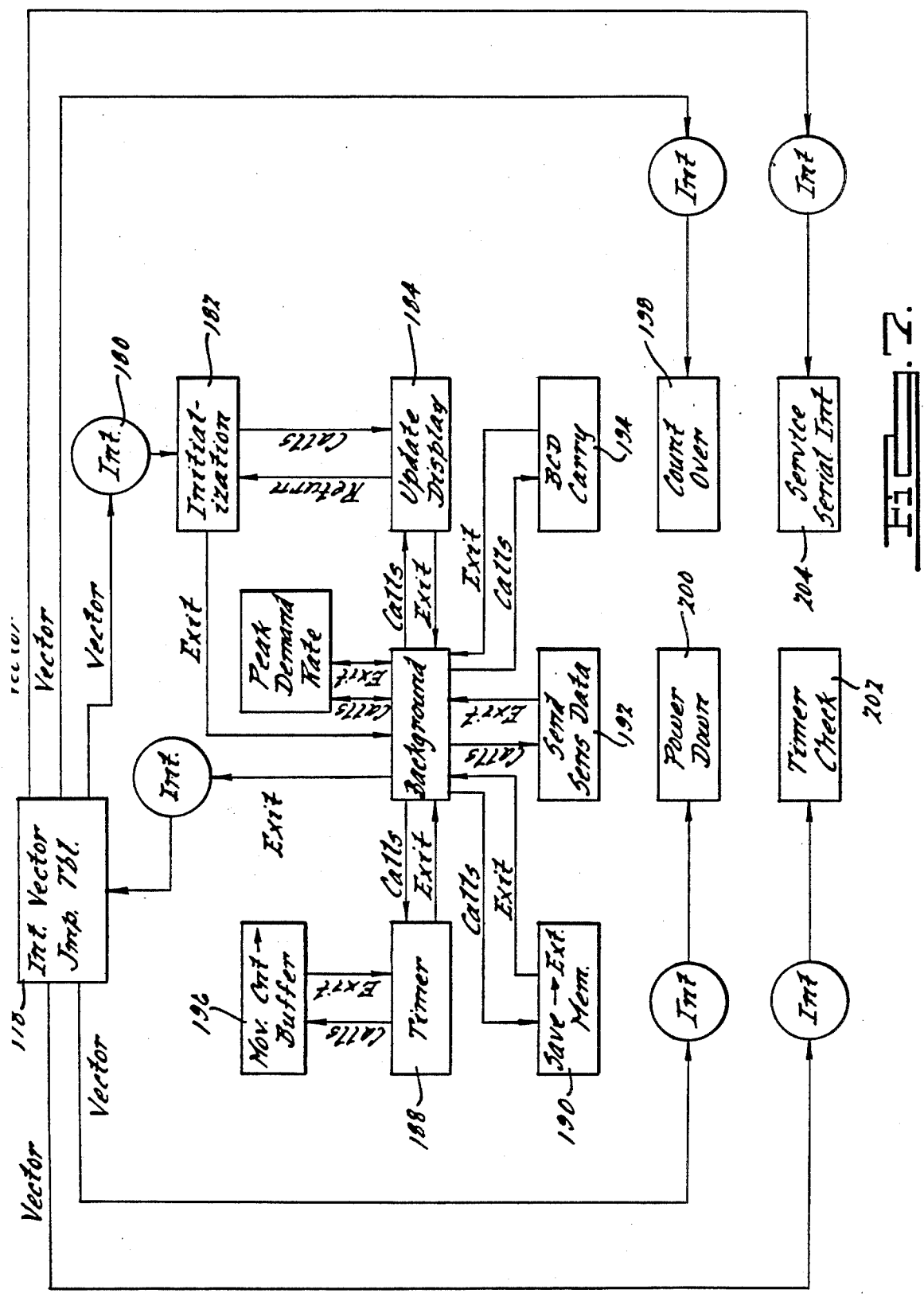

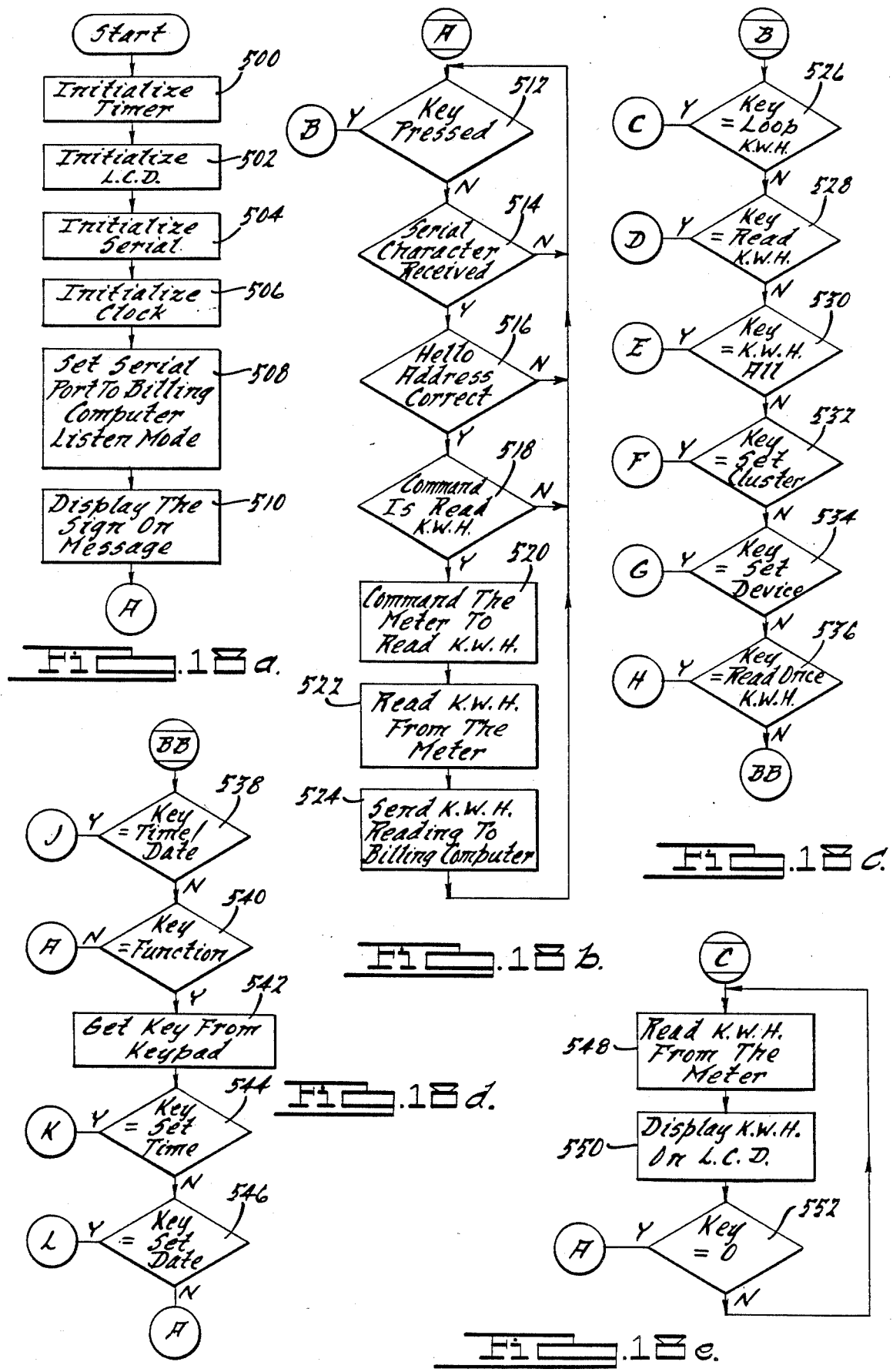

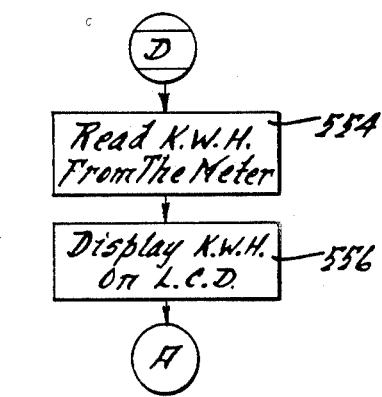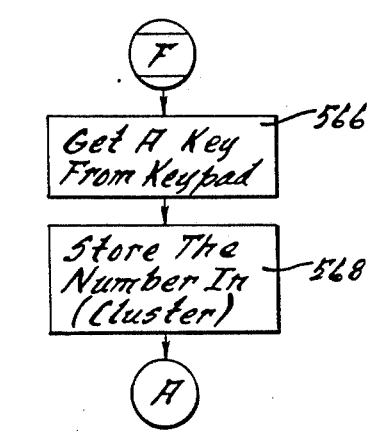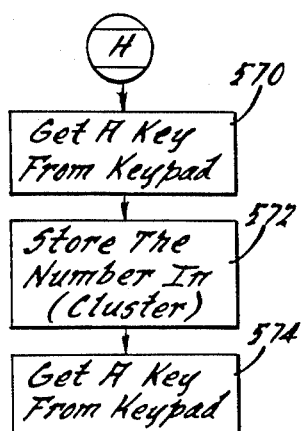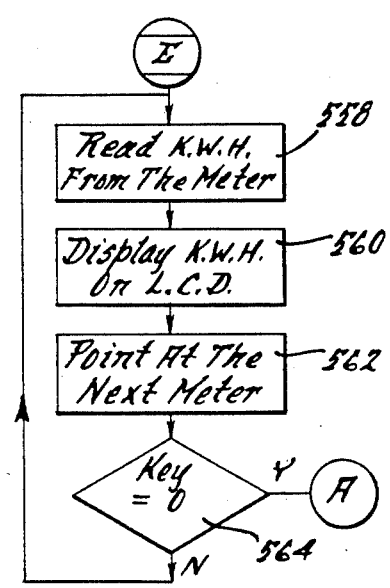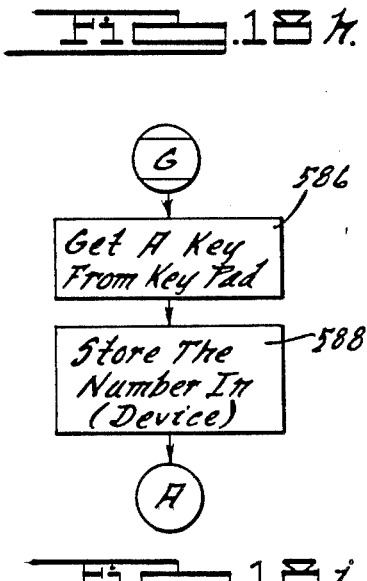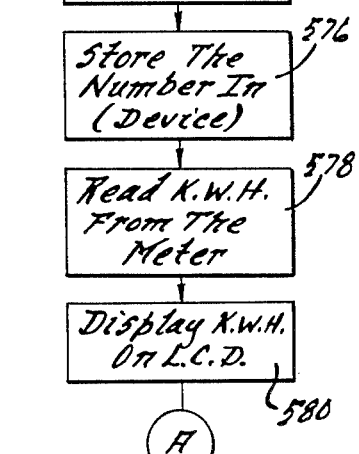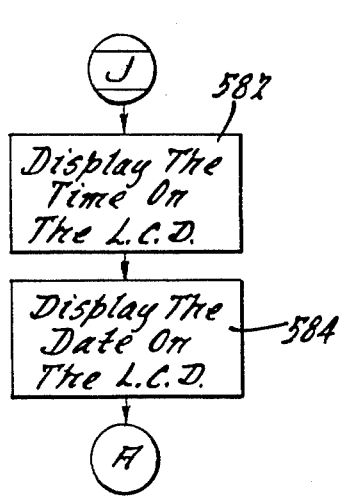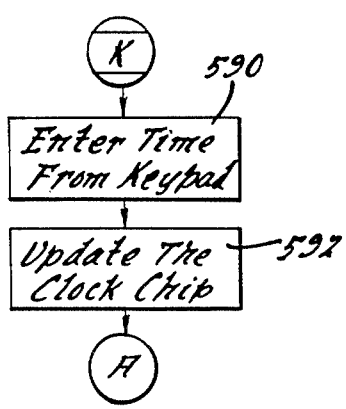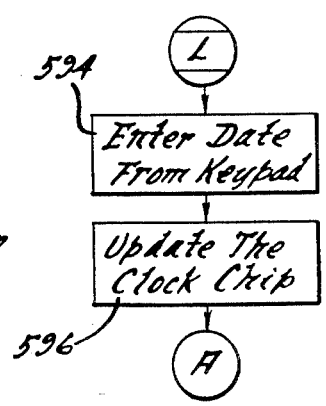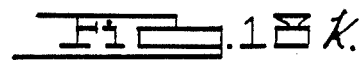

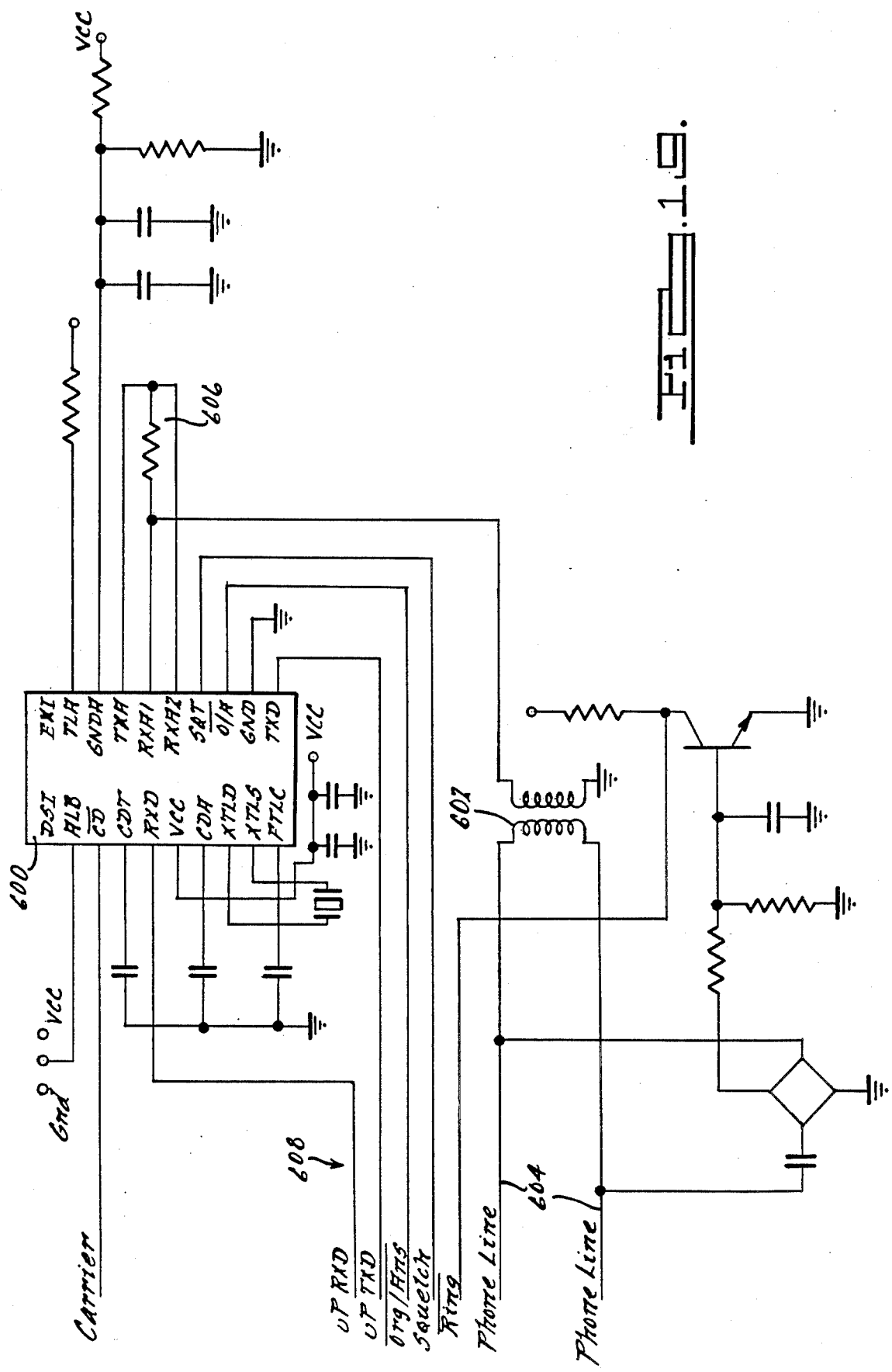

UTILITY METER AND SUBMETERING SYSTEM

CROSS-REFERENCE TO RELATED APPLICATION

This is a continuation-in-part of U.S. Application Ser. No. 802,452, filed Nov. 27, 1985, by Marvin P. Selph, entitled "Utility Meter," now abandoned.

BACKGROUND AND SUMMARY OF THE INVENTION

The present invention relates generally to meters for measuring utilities consumed at a residence or business and more particularly to a microprocessor-based automatic remote metering system for measuring the consumption of utilities, such as electric power, water, gas and the like.

Presently utilities, such as electric power, water, gas and the like, are sold to residential and business consumers on a usage metered basis. Generally, separate metering devices are used for each utility, with each meter requiring periodic reading by the consumer or by utility company meter readers. The vast majority of utility meters in use today are either mechanical or electromechanical devices which convert measured utility consumption into some form of rotary movement to advance a rotary dial or cylinder which provides a visual indication of utility consumption. Mechanical or electromechanical meters of this type are inherently inaccurate, particularly at low consumption levels. As an example, a conventional electrical power meter or watt hour meter typically does not respond at energy levels below 32-38 watt seconds. To the electric utility company, the energy consumption below this level represents unbilled energy. The cumulative effect of this lost billing is substantial, when totaled for a year across the entire customer base. In addition, electromechanical meters consume power in making the measurement. The power consumed by a typical watt hour meter costs each consumer an average of about $12.80 a year. Hence, both the utility company and the consumer would benefit from a more accurate and efficient meter.

Aside from inaccuracy and high power consumption, conventional utility meters do not have remote reading capabilities, nor can they be easily retrofitted to include remote reading capabilities. The remote reading capability would eliminate the time and expense of walking door-to-door to read each meter and would, therefore, be a very desirable feature.

In addition, in some applications such as in multiple dwelling apartment complexes, in office complexes, in schools and universities, in large corporations, and in companies that use heavy equipment, it is also very desirable to have remote reading capabilities. In these applications, a form of submetering would be desirable, in that it would allow the complex owner or company manager to collect and monitor utility usage from a centralized vantage point. In apartment and office complexes, the ability to effect submetering would result in a fair distribution of utility billing to the tenants. In schools, universities and large corporations, submetering would permit these organizations to conserve energy by locating where utilities are wasted. In addition, companies which use heavy equipment could use submetering to provide a peak demand alarm to alert the plant manager when the level of consumption increases into a higher billing rate level. The company could then shed some of the load it is using in order to return to a lower billing rate level. Prior art metering systems do not adequately address these considerations.

Most present day meters are designed to be manually read, say at monthly intervals, and provide a readout of the total cumulative consumption to date. Conventional meters do not provide time of use information, that is, information concerning the instantaneous consumption at a preselected time. In the electric power industry, for example, time of use information can be quite useful and important. Electric consumption is not ordinarily uniform throughout the day. In the summertime, for example, consumption is ordinarily much higher during the hot hours of the day when air conditioning equipment is running. In larger metropolitan areas, particularly those with heavy industry, the air conditioner load coincides with the business and industrial load to create a peak energy demand which may be much higher than the average demand throughout the year. To prevent brownouts or blackouts, the electric utility company must have enough ready reserve of generating equipment to supply this peak demand. During off peak hours this reserve is unused. It is naturally expensive to maintain a ready reserve to supply peak demand, particularly since the reserve periodically stands idle. It would, therefore, be desirable to bill electric consumption at a higher rate during peak hours and at a lower rate during off peak hours. In order to apply the correct billing rate, it is necessary to be able to determine not only how much power was used but also when. Time of use metering is, therefore, highly desirable.

In addition to time of use metering for peak/off peak billing purposes, time of use data would also be potentially useful in monitoring the utility needs of the customer base in planning for future expansion, in optimizing the utility network and in trouble shooting power outages and service interruptions. In the electric utility industry, for example, it is helpful to have time of use information when selecting the power rating of distribution transformers, in balancing a three-phase distribution system so that each phase is equally loaded, and in trouble shooting and locating the cause of power surges or dropouts. Present day utility meters are generally deficient in providing this information.

The present invention represents a marked improvement over prior art utility meters. The invention comprises at least one and optionally several means for sensing utility usage. Electric power consumption is measured using a magnetic field responsive device which includes a Hall effect device. The sensor is quite accurate, even at low energy consumption levels, and provides no insertion loss to affect accuracy. In addition to sensing electric power consumption, the invention is also capable of receiving, arbitrating and processing signals from other utility sensors including water flow sensors, gas flow sensors, and other utility metering devices. Further, the invention can also sense and report emergencies such as fire or intrusion.

The invention further comprises a processor or microprocessor which responds to the utility sensor or sensors and provides digital information indicative of utility usage. A memory, such as a random access memory, is coupled to the processor for storing the digital information. The processor also includes analog to digital interfacing equipment for converting analog signals of the utility sensor into digital signals for manipulation by the microprocessor. A display, such as an LED or liquid crystal 7 segment display, is responsive to the processor and provides a visual indication of the digital information provided by the processor. In addition, a communication means is coupled to the processor for transmitting the digital information to a location remote from the meter. The communication means may be adapted to communicate over a telephone system, over a fiber optic communication system or over other communication links, including transmission lines and radio links. When telephone communication is employed, the processor provides an output for serial communication with a modem circuit.

In addition to providing a visual indication of utility usage via the display and a remote indication via the communication means, the invention further comprises a control means for causing the processor to monitor the digital information as it is received or at periodic intervals and to provide an alarm event indication in response to a predetermined fault condition. For example, the processor can be programmed to respond to an interruption in utility service or a degradation in utility service by storing a record of the event and the time at which the event occurred in memory. The memory may be accessed remotely through the communication means to get details of the alarm event even after it has occurred. In the alternative, the processor can automatically provide an alarm event indication to the central office, monitoring substation or other remote location via the communication means. The electronic circuitry of the invention derives its primary operating power from the utility itself and may include a backup power source comprising a storage battery and a low battery detection circuit. Upon primary power failure, the battery backup power source operates the processor and associated circuitry to ensure that no data is lost.

The invention is housed in an enclosure which prevents physical tampering with the electronic circuitry. The entire package, including housing, is capable of being mounted into an existing four-jaw meter socket. The enclosure includes a tamper detection device associated with the housing and coupled to the processor. The tamper detection device transmits a tamper alert signal which the processor can output through the communication means to the home office or monitoring substation. To provide further protection against meter malfunction due to processor lockup, a watchdog circuit is coupled to the processor and provides a reset signal in response to processor inactivity for a predetermined length of time. If the processor becomes inactive or locks up due to tampering or spurious power line signals, the watchdog circuit detects this condition and restarts the processors control routine.

The invention is further capable of providing a utility metering system for metering multiple utility users. In accordance with the invention, a plurality of utility metering devices responsive to the utility consumption of the utility users provide utility data signals indicative of the consumption. At least one data collection computer is provided, having data input/output means for communicating with the metering devices. The data collection computer collects the utility data signals provided by the utility metering devices. A billing computer has a means for communicating with the data collection computer and for receiving the collected utility data signals from the data collection computer. In this fashion, a submetering system may be constructed in which a great number of individual utility meters can communicate with a data collection computer, which in turn can be networked with a great number of other data collection computers for communicating with a central billing computer. The individual utility metering devices may be located in each apartment of a multiple dwelling apartment complex, for example, while the data collection computer may be located in the manager's office. If desired, at least one of the utility meters may be provided with a means for sensing fire or intrusion into a protected space. Thus, the utility metering system can also alert the manager or tenant of an emergency such as fire or breaking and entering. The data collection computer can also include an automatic telephone dialer and communication device for placing a telephone call in response to the emergency condition or in response to a predetermined utility usage. In addition, the data collection computer can also be provided with both audible and silent alarms for providing an alerting signal in response to emergencies or in response to predetermined utility usage.

For a more complete understanding of the invention, its objects and advantages, reference may be had to the accompanying drawings and to the following specification.

BRIEF DESCRIPTION OF THE DRAWINGS

FIG. 1 is a perspective view of the utility meter in an exemplary installation;

FIG. 2 is a block diagram illustrating the remote reading meter with a presently preferred telephone telemetry system;

FIG. 5 is a schematic diagram of the power sensor board of the invention;

FIGS. 6A and 6B comprise a schematic diagram of the processor and display board of the invention;

FIG. 7 is a software block diagram of the control means of the invention;

FIG. 9 is a frontal perspective view of the meter showing protective enclosure and face plate;

FIG. 18a–18m comprise a flow chart diagram useful in understanding the operation of the data collection computer; and FIG. 19 is a schematic diagram of the modem circuit of the data collection computer.

DESCRIPTION OF THE PREFERRED EMBODIMENT

Figure 3:
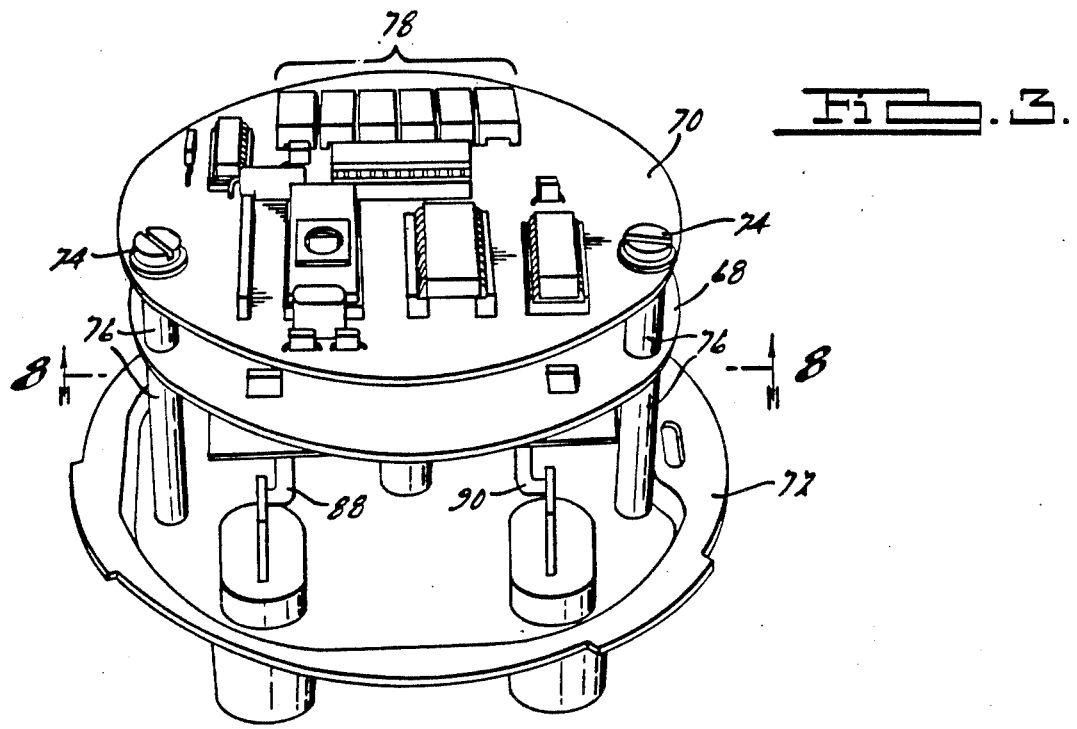
FIG. 3 is a frontal perspective view of the meter with protective enclosure removed to reveal the circuit board layout.

Referring to FIG. 1, the utility meter of the invention is illustrated generally at 20. Meter 20 is installed in conventional four-jaw meter socket 22 which is attached to the lower end of riser conduit 24. Meter socket 22 is secured to the building structure 26, or to a utility pole or other appropriate mounting structure. The electric utility service enters through service drop cable 28, which may include one or more hot conductors and neutral. The electric utility service enters riser conduit 24, passes through socket 22 and enters the building structure through entrance cable 30. As will be explained in detail below, meter 20 measures the magnetic field generated by the incoming electric current. Entrance cable 30 enters building structure 26 for attachment to a distribution panel 27 with fuses or circuit breakers in the usual fashion.

One of the advantages of the invention is that it readily provides remote meter reading capabilities through a number of different possible data telemetry systems including telemetry over commercial telephone lines, radio transmissions, fiber optic cables, dedicated transmission lines, AC power lines and the like. Although the invention may be implemented using any telemetry system, commercial telephone lines are quite prevalent and, hence, presently preferred. Accordingly, FIG. 1 illustrates incoming telephone line 32 which enters network interface 34 in the usual fashion. Attached preferably on the customer side or subscriber side of network interface 34 is a meter interface unit 36 (MIU). Meter interface unit 36 is coupled to meter 20 and provides communication between the meter and the commercial telephone network. Meter interface unit 36 may be housed within the protective enclosure of utility meter 20 if desired.

Another advantage of the invention is its capability of monitoring other utility services besides electric service. In general, the invention is capable of monitoring any metered utility, including gas and water. For purposes of illustrating this aspect of the invention, FIG. 1 depicts water meter 38 and gas meter 40. Meters 38 and 40 are coupled to meter 20 of the invention through connection lines 42. Meters 38 and 40 may be conventional flow measurement meters which include or have been retrofitted with electrical readout capabilities. The electrical readout signals from meters 38 and 40 are delivered to the utility meter 20 of the invention through connection lines 42. Once supplied to meter 20 these readout signals are analyzed, stored and processed for eventual access by the appropriate utility company over telephone line 32. Meter 20 arbitrates which utility signals (electric, gas, water, etc.) are input, stored and analyzed at any given time. The utility signals may be sequentially sampled at a sufficiently rapid rate that sampling error is negligible.

Turning now to FIG. 2, a presently preferred data telemetry system using commercial telephone networks is illustrated. FIG. 2 depicts utility meter 20 with an optional second utility meter (such as water or gas) indicated generally at 44. For purposes of explaining the invention, meter interface unit (MIU) 36 is illustrated as external to meter 20. Of course, as stated above, meter interface unit 36 may be incorporated within the utility meter package itself. Meter interface unit 36 is coupled to meter 20 through input leads 46 which have also been given the individual designations RXD, TXD and TRIG used in FIG. 6A and discussed below. The output of meter interface unit 36 couples to tip wire 48 and ring wire 50 of the test trunk line of a commercial telephone network. The tip and ring wires are in turn connected through network interface 34 to the telephone company network or loop 52 which routes calls to the utility customer by means of switching circuits within telephone company central office 54. The test trunk line may be accessed by the switching circuits in the conventional fashion to access a customer's phone circuit without activating the ringer.

In order to communicate with the meter interface unit the utility company, e.g. the electric utility company, has a data communication terminal 56 which includes a computerized processor subsystem 58 and data communication interface unit 60 which is coupled through the telephone network or through a dedicated phone line 62 to the MRAC unit 64 within the telephone company central office. When a particular customer's meter is to be read, the computerized processor subsystem 58 dials or accesses the MRAC unit 64 in central office 54, thereby sending a request for a certain customer's meter to be read. The MRAC unit 64 accesses the customer's phone line through the test trunk line. The MRAC unit opens the line to the customer's phone but does not assert a ring signal (so the residential phone does not ring). Instead, the MRAC unit asserts a special tone that triggers the meter interface unit 36. Upon being triggered, meter interface unit 36 reads the data corresponding to utility usage which is supplied to it by the circuitry of meter 20 discussed below. The meter interface unit then assembles or packages the data in a predefined format or protocol and transmits that data back to the MRAC 64. The MRAC in turn interprets or unpackages the MIU data and reports it back to the computerized processor subsystem 58 where the customer's utility consumption and time of use data is analyzed.

While other communication circuits are also possible, the presently preferred meter interface unit includes at least one universal asynchronous receiver transmitter (UART), a Bell 103 standard modem circuit (300 baud) and an active bandpass filter. Preferably the meter interface unit is implemented using CMOS integrated circuitry so that the entire unit runs on power supplied by the telephone line. A suitable meter interface unit is available from Base 10 Systems, Trenton, N.J. Other meter interface units are also useable, however.

Figure 4:
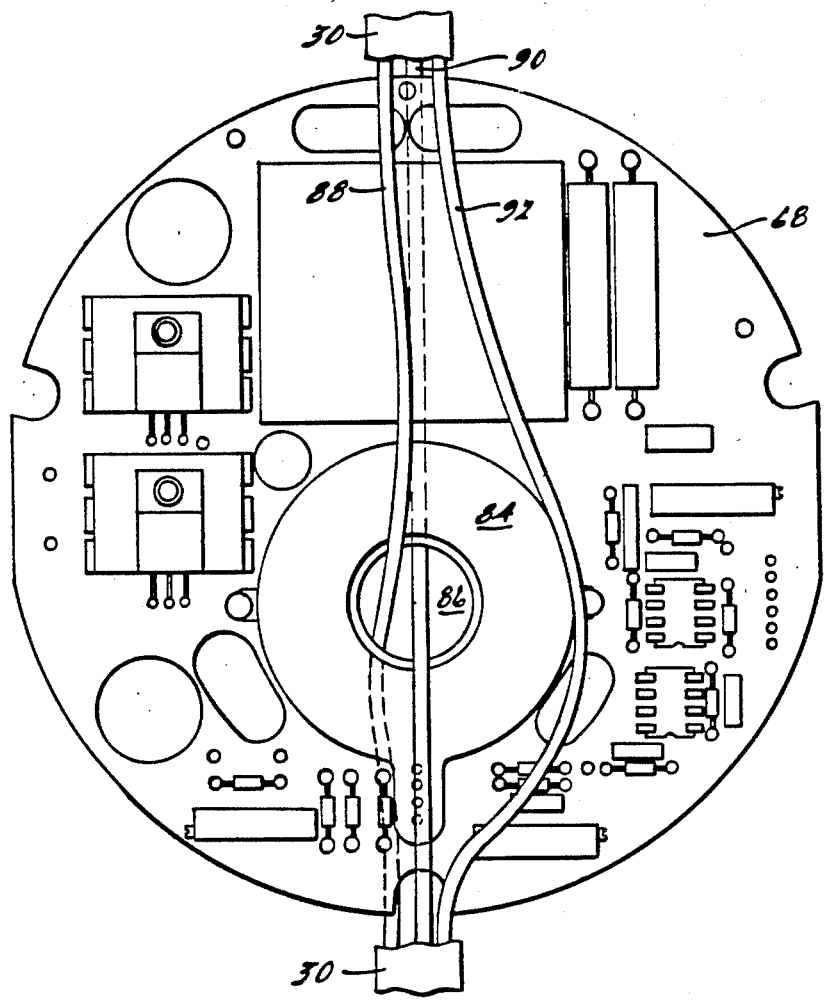
FIG. 4 is a cross-sectional view taken substantially along the line 4—4 in FIG. 3 and illustrating the underside of the power sensor board.

FIGS. 3, 4 and 9 illustrate the presently preferred physical layout of the invention. The invention is adapted to plug directly into existing four-jaw meter sockets, such as socket 22 (FIG. 9). The circuitry is housed within a protective glass or plastic enclosure 66 which has an overall size and shape comparable to the glass enclosures found on conventional electromechanical watt hour meters. If desired, a microswitch 67 or other sensor can be positioned to contact the enclosure 66 so that removal of the enclosure will be detected. FIGS. 3 and 4 illustrate the meter with enclosure removed. The electronic circuit which comprises meter 20 is preferably assembled on two spaced apart and parallel circuit boards 68 and 70. Both boards are circular to conform to the interior shape of protective enclosure 66. Circuit board 68 is the current sensor board and circuit board 70 is the processor/display board.

Preferably circuit boards 68 and 70 are assembled on base plate 72 by means of bolts 74 and spacers or standoffs 76. The boards may be assembled with their respective foil sides facing one another. Secured to the component side of processor display board 70 are a series of seven-segment LED or liquid crystal alphanumeric display devices 78. Display devices 78 are positioned behind a rectangular opening 79 in the face plate cover 82 (FIG. 9) and are, therefore, visible through the protective enclosure 66.

Figure 8:
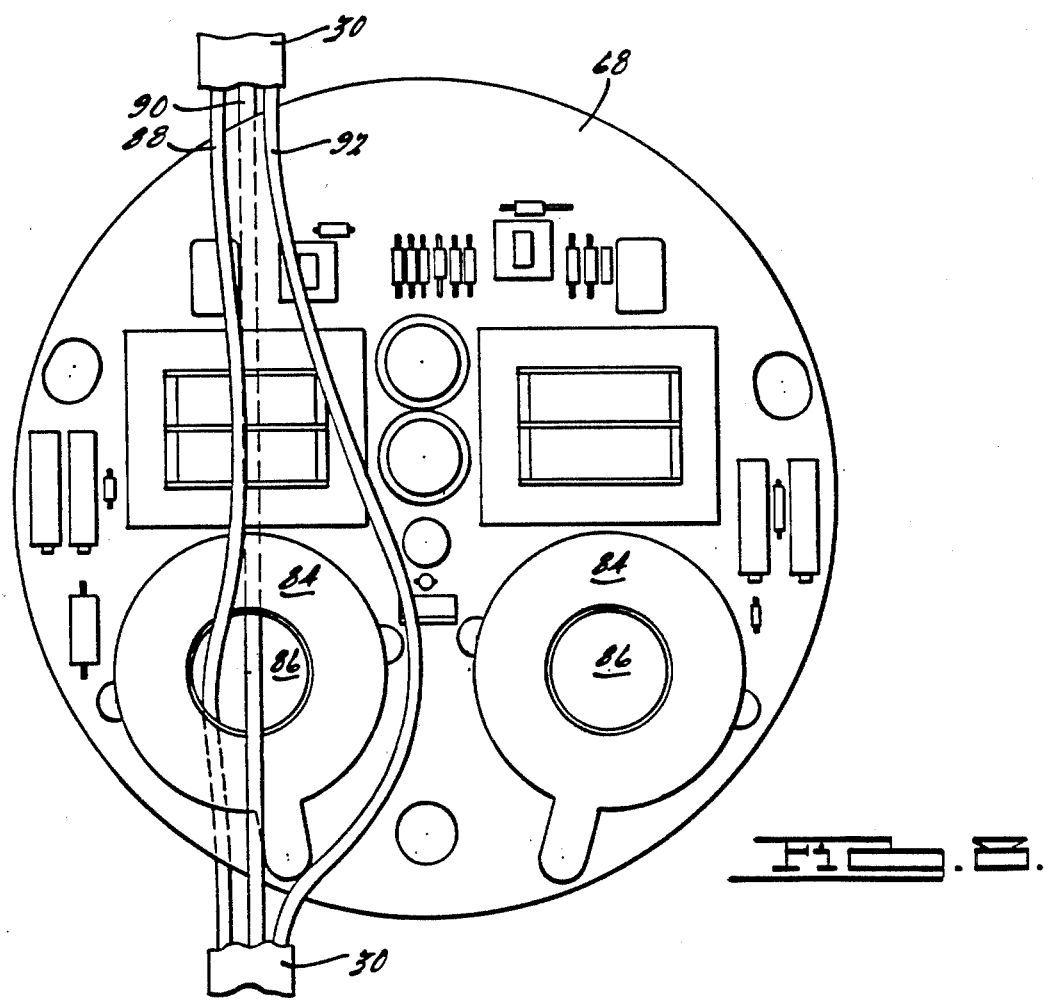
FIG. 8 is a cross-sectional view, similar to FIG. 4, illustrating an alternate embodiment of the invention.

Current sensor board 68 carries at least one toroidal Hall effect sensor 84 (two are shown in FIG. 8). Hall effect sensors 84 have a circular opening 86 aligned with a similar opening through board 68 through which the current delivering conductors are fed. FIG. 4 illustrates entrance cable 30 as comprising three individual conductors 88, 90 and 92. Conductor 92 is the neutral conductor and conductors 88 and 90 are the current delivering conductors coupled to the secondary windings of a pole mounted or pad mounted stepdown transformer. According to customary practice, conductors 88 and 90 are both ultimately wired to the distribution panel along with the neutral conductor 92. Standard 110 volt outlets are then connected between the neutral conductor 92 and either one or the other of conductors 88 and 90. If required, 220 volt outlets are wired across conductors 88 and 90. Conductors 88 and 90 are both hot conductors carrying currents which are 180 degrees out of phase. To ensure that all power delivered to the building is metered and billed, conductors 88 and 90 are both fed through circular opening 86 in one of the toroidal Hall effect sensors 84. Since the currents on these two conductors are out of phase with one another, one conductor is fed upwardly through opening 86 and the other conductor is fed downwardly through opening 86, so that the magnetic fields surrounding the two conductors add to one another. This is shown in FIG. 4 and also in FIG. 8.

In the alternate embodiment illustrated in FIG. 8, two toroidal Hall effect sensors 84 are illustrated although only one is being used; the other remains unused. A second and even a third Hall effect sensor may be included for use in multiphase applications. In the alternative, additional Hall effect sensors may be used to meter the power consumption of a different customer at the same address. In duplex apartments, one meter could, therefore, be used to service both tenants. In single customer applications and single phase applications, the additional Hall effect sensors may be eliminated if desired.

Referring to FIG. 5, the power sensor circuitry associated with circuit board 68 is illustrated. The current sensor circuit comprises a power supply circuit indicated generally at 94. Power supply circuit 94 is receptive of electrical energy by coupling to conductors 88 and 90 through fuses 96. Fuses 96 are in turn connected to the primary leads of stepdown transformer 98, which provides two pairs of secondary winding outputs 100 and 102. Metal oxide varistors (MOV) 104 are coupled between each of the fuses and the external ground 106 to provide surge protection. Secondary leads 102 supply stepped down alternating current to full wave bridge rectifier 108 to which filter capacitors 110 are coupled. The negative side of rectifier 108 is grounded and the positive side is connected to a voltage supply bus 112 to which voltage regulators 114 and 116 are connected. Preferably voltage regulator 114 supplies 12 volts DC while voltage regulator 116 supplies 5 volts DC.

Secondary leads 100 are coupled through a resistor network 118 to the toroidal Hall effect sensor 84. Resistor network 118 includes an adjustable rheostat 120 and a temperature compensating thermistor 122. Hall effect sensor 86 may be implemented using a PI Series current/watt sensor manufactured by F. W. Bell, Orlando, Fl. Sensor 86 provides two bias leads S1 and S4 and two output leads S2 and S3. Sensor 86 operates on the principle of Ampere's law which states that the current in a conductor produces a proportional magnetic field surrounding the conductor. The sensor includes a gapped toroidal core with a Hall generator mounted in the gap. The core concentrates the magnetic field produced by the current in the conductor which passes therethrough and passes that magnetic field through the Hall generator. The Hall generator is a magneto-sensitive semiconductor which provides an output voltage proportional to the product of the magnetic field normal to its surface and the control current flowing through it at the bias voltage. The control current is supplied through bias terminals S1 and S4. The Hall effect sensor (being responsive to both the current flow and the bias voltage) is proportional to the power consumed. The output voltage of sensor 86 is delivered to operational amplifier 124 which is configured with feedback capacitor 126 to act as an integrator. The output of operational amp 124 is an analog DC level proportional to the time integral of the power sensed by sensor 84.

In addition to adjustment rheostat 120, the circuit also includes a bias potentiometer 128 for adjusting the level of signals input to operational amp 124. A pair of test terminals 130 are provided at both sensor output terminals S2 and S3. By shorting out test terminals 130 during calibration, sensor 84 is effectively removed from the circuit and no input signal is fed to operational amplifier 124. In this state, potentiometer 128 may be adjusted to produce a zero volt DC level at the output of amplifier 124. With the short removed from terminals 130 and with either a known test current or no test current flowing through the opening 86 of sensor 84, adjustment rheostat 120 can be tuned to produce the correct output at operational amplifier 124.

The output from operational amplifier 124 is delivered to a voltage to frequency converter 132, which may be implemented using a LM 131 integrated circuit. The voltage to frequency converter effects a form of analog to digital conversion. The conversion is made by sampling the converters output on lead 134 for a fixed-time interval and counting the number of pulses or oscillations produced. The number of pulses or oscillations produced is proportional to the DC level supplied by amplifier 124. Knowing the sampling time interval, the number of counted pulses is proportional to the DC level and, hence, is indicative of the energy flowing through the circular opening 86 of sensor 84. Coupled to output lead 134 is a pullup resistor 136 which is coupled to the five-volt supply makes the output of converter 132 compatible with digital logic levels.

Figure 6B:
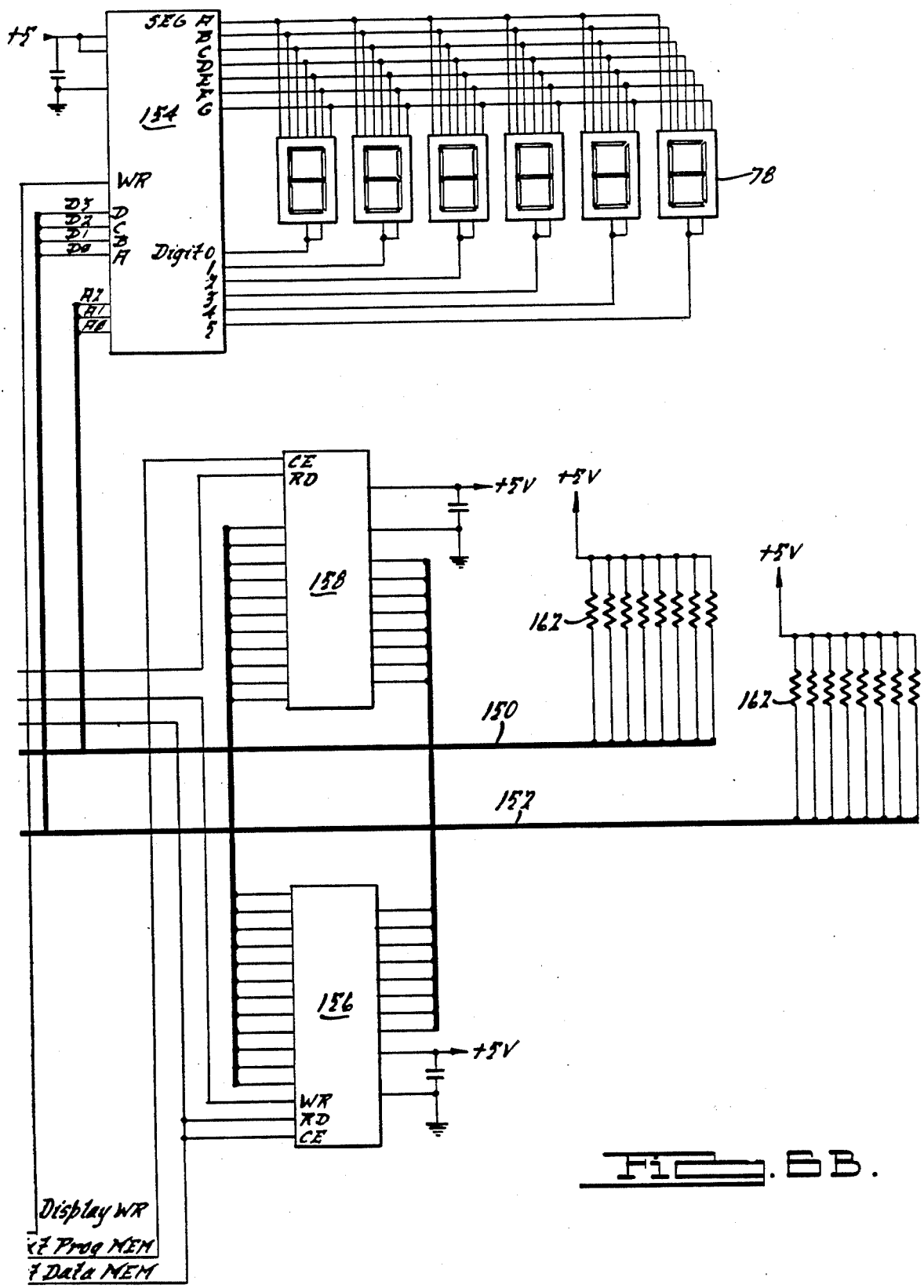

Turning now to FIGS. 6A and 6B, the processor/display circuit comprises microprocessor 138, such as an Intel 8751 microprocessor. In FIG. 6A the input and output leads of microprocessor 138 have been labeled with their customary designations. External crystal 140 provides a 4 MHz. time base. Microprocessor 138 communicates with the address/data bus 142, which provides 8 parallel data bits and 16 parallel address bits.

Microprocessor 138 also includes 8 serial input/output ports P1.0–P1.7. Microprocessor 138 includes internal random access memory (RAM) and is also capable of addressing external memory through the address/data bus 142. When internal memory is being used, the EA terminal of microprocessor 138 is jumpered to the five-volt supply as with jumper connection 144. When external memory is being used in place of the internal memory, the EA terminal is jumpered to ground as with jumper 146. Microprocessor 138 includes an external timer input (T0) to which the voltage to frequency converter output lead 134 is connected. The receive and transmit serial data terminals (RXD and TXD), together with input/output port P1.0 (used for trigger signals) communicate with a meter interface unit, such as unit 36 (FIG. 2). Microprocessor 138 also includes interrupt terminals INT1 and INT0 and a reset terminal RESET. To provide a proper interface between microprocessor 138 and external memory, latch circuit 148 is provided. Latch 148 may be implemented using a 74LS373 integrated circuit and is coupled to the shared address/data lines of address/data bus 142. The output of latch 148 comprises the least significant bits (LSB) of the 16 bit address word. Together with the remaining address lines of bus 142, the output of latch 148 provides the address bus 150. The data bus 152 is derived from the input leads to latch 148. The address latch enable or ALE terminal of microprocessor 138 provides the logic signal to indicate whether the information input to latch 148 is address information or data information.

In the presently preferred embodiment the local display of kilowatt hours consumed is provided by 7 segment display devices 78. Display devices 78 are driven by display driver circuit 154, which may be a ICM7218D integrated circuit. The display driver is addressed by the A0, A1 and A2 address lines. Data is provided on the D0–D3 data lines.

In addition to the internal random access memory within microprocessor 138, the invention also includes nonvolatile data storage memory 156 and optional program storage memory 158. Memory 156 may be implemented using EEPROM devices such as a 2816 integrated circuit. Program memory 58, if used, may be a 2716 integrated circuit EPROM, or the like. In order to permit microprocessor 138 to selectively address the data storage memory 156, the program memory 158 or the display driver 154, a device select circuit 160 is provided. Circuit 160, which may be a 74LS138 integrated circuit, is coupled to the most significant address lines A13–A15 and provides device select output signals to the write terminal WR of display driver 154 and to the chip enable terminals CE of memory circuits 156 and 158. Microprocessor 138 can select which of these devices it needs to address by placing the appropriate address signals on address lines A13–A15. Memory circuits 156 and 158 are also coupled to the read RD and write WR terminals of microprocessor 138 in the usual fashion. As illustrated, data bus 152 and most significant bits A8–A15 of address bus 150 are connected through pullup resistor banks 162 to the five-volt supply.

As discussed above, the electronic circuit of the invention is primarily powered by connection to the incoming AC line. The circuit is also capable of being powered from an auxiliary battery supply power source 167 as discussed above to operate a real time clock 169, which communicates with ports P1.4 and P1.5 and is used in time of use measurements. To protect against faulty readings during brownouts, a voltage monitoring circuit 164 is provided. Circuit 164 includes a Zener diode 166 which is coupled to the VTEST test point on voltage supply bus 112 (FIG. 5). When the voltage on supply bus 112 drops below the Zener threshold, logic gate 168 initiates a signal which in turn causes logic gate 170 to generate an interrupt signal on the INT0 line of microprocessor 38. The zero interrupt is a high priority interrupt which causes microprocessor 138 to effect a power shutdown routine whereby all data currently being processed is stored in nonvolatile data storage memory 156 along with the microprocessor machine state. The routine thus preserves valid data and causes potentially invalid subsequent data to be ignored. Once proper voltage levels have been restored, microprocessor 138 recovers its former machine state and continues processing data in the usual fashion.

For protection against program lockup, watchdog circuit 172 is provided. During normal operation, microprocessor 138 executes a programmed set of instructions (contained within internal memory or optionally within program memory 158). Should a power surge or momentary power dropout occur, or should someone attempt to tamper with the programmed instructions, it is possible for a program lockup to occur. Lockup occurs when the program counter within microprocessor 138 loses its place in the program and the microprocessor attempts to execute an unintended instruction, often with unpredictable results. To protect against such lockup, microprocessor 138 is programmed to periodically send a watchdog signal via port P1.7. Logic gates 174 and 176 monitor the watchdog signal and respond when the watchdog signal is absent by resetting microprocessor 138 via the RESET terminal. Thus, if microprocessor 138 locks up and ceases to send watchdog signals, the processor is reset to a predetermined starting point within the control program.

With the foregoing hardware description of the invention in mind, the control program will now be described. Referring to FIG. 7, the control program executed by microprocessor 138 is illustrated in terms of its functional subroutines or modules. In FIG. 7 the modules are represented by blocks, interconnected to illustrate program control flow. Interrupt events are depicted by circles. Preferably the control program is written in assembly language or machine language and stored within some form of nonvolatile memory, either in the microprocessor's internal memory or within optional program memory 158. The control program may be coded directly as assembly language instructions or it may be compiled or interpreted using higher level computer languages to implement the algorithm of FIG. 7.

Preferably the control program implements both hardware and software interrupts; and, accordingly, the control program includes an interrupt vector jump table 178. When a hardware or software interrupt occurs, the control program consults the interrupt vector jump table to determine where program control should resume, based on the interrupt number or its identity. For example, a reset signal on the RESET terminal is treated as a hardware reset interrupt. Similarly interrupts received on INT0 and INT1 lines are also hardware interrupts. The number zero interrupt (INT0) is used to initiate the power down mode, while the number one interrupt (INT1) is used for transmitting data. Other interrupts, including software interrupts, may also be included in the jump table. The other interrupts will be discussed in connection with the portions of the program which generate those interrupts.

Upon power up or upon a hardware reset, denoted at 180, program control enters the initialization routine 182. The initialization routine initializes the microprocessor's serial port to the communication baud rate (e.g. 300 baud). The microprocessor's internal timer 1 is used to generate the serial port baud rate. The serial port is configured for one start bit, one stop bit and eight data bits. At this time, the interrupt for the serial port is enabled and the number one interrupt (INT1) is also enabled. The initialization routine then reads data storage memory 156 to obtain the last stored data, indicative of energy usage to date. The last stored data is then written to display devices 78 by calling the update display routine 184 described further below. Upon completing the initialization process, initialization routine 182 exits to background routine 186.

Background routine 186 is the normal operating routine from which the other routines are called. It coordinates the other routines, calling them when necessary. Program control does not normally exit from background routine 186, unless caused to do so by a hardware interrupt. As illustrated in FIG. 7, background routine 186 can call a number of different routines, including timer routine 188, save to external memory routine 190, send sensor data routine 192, binary-coded decimal carry routine 194 and update display routine 184. When one of these routines is called by background routine 186, control branches to that routine and then returns to the background routine when finished.

Many of the routines are called by background routine 186 at periodic time intervals. Timer routine 188 and time check routine 202 are responsible for providing timing information to the background routine. The timer check routine 202 is responsive to the timer 1 interrupt produced internally by the microprocessor. Timer check routine 202 measures various time intervals by incrementing software counters and provides an indication of the measured time intervals by setting software flags. One such flag is a 10 millisecond flag which background routine 186 uses to call timer routine 188. Another flag is the calibration flag which is set and reset every 100 milliseconds and causes microprocessor ports P1.4 and P1.5 to alternately toggle between set and reset states. During meter calibration, ports P1.4 and P1.5 are monitored to determine whether critical timing functions are within specifications.

Timer routine 188 works in conjunction with timer check routine 202 to keep track of the times at which the other routines are called from background. Timer routine 188 is called from background every 10 milliseconds as determined by the 10 millisecond flag controlled by timer check routine 202. Timer routine 188 controls software counters which measure time intervals of 20 milliseconds, 100 milliseconds and 1 second. Software flags are set and reset to convey this timing information to background routine 186. The 20 millisecond timer is used to regulate the speed at which data is written to data storage memory 156 following a write instruction from the microprocessor. The 100 millisecond timer is used to control the rate at which data is transmitted through the communication port in response to a trigger signal on port P1.0. The 1 second timer is used to prevent creep. Creep is a phenomenon caused by noise in the analog circuitry whereby the value indicative of energy usage slowly creeps up or increases when no energy is being consumed. This creep is corrected for by discarding energy consumption data which is below the noise threshold level. Once each second the data is tested for creep, and if above the noise threshold, the present reading data is placed in a temporary storage buffer by calling the move count to buffer routine 196. Routine 196 stores the present reading where it may be accessed by other routines, such as the save to external memory routine 190.

The save to external memory routine 190 is called by background routine 186 every 20 milliseconds (as determined by timer routine 188). Routine 190 moves the data from the temporary buffer to the data storage memory 156. Preferably this data is stored in a binary-coded decimal or ASCII format. Routine 190, by virtue of the 20 millisecond delay, allows the data captured in the temporary buffer to be written to the comparatively slower nonvolatile memory device of data storage memory 156 without delaying the other routines.

The send sensor data routine 192 transmits data through the serial communication port. If a trigger signal is received from meter interface unit 36, then following a 100 millisecond delay, the present meter reading is sent at 300 baud through the serial port with even parity. A header comprising an ASCII asterisk character followed two additional ASCII characters receives the present meter reading value. If stored as binary coded decimal digits, the meter reading value is converted to ASCII prior to being transmitted. The service serial interrupt 204 works in conjunction with the send sensor data routine 192. The service serial interrupt 204 responds to an interrupt generated when the meter interface unit wishes to communicate with the microprocessor. Routine 206 determines whether the communication request is to receive or transmit data. If a request to transmit is sent, routine 206 sets a flag which enables the send sensor data routine 192.

The update display routine 184 causes the data indicative of watt hours consumed to be displayed on display devices 78. Routine 184 does this by enabling display driver 154 using device select circuit 160. Driver 154 is then addressed and data is output to the display devices in binary coded decimal format. In order to implement a binary-coded decimal format, binary coded decimal carry routine 194 is called to check and determine whether the most significant digit is over 10, in which case a carry to the next decimal place occurs.

In addition to the routines called from the background routine, the program also includes other interrupt driven routines. Power down routine 200 is responsive to the number zero interrupt (INT0) which is activated by voltage monitoring circuit 164. As explained above, circuit 164 generates the number zero interrupt when the AC line voltage drops below a safe level. The power down routine 200 freezes the internal clock, causing all functions to stop. The present meter reading is retained in memory 156 and a hardware reset is initiated so that the power is restored and the control resumes at routine 182.

The routine for interpreting the power usage data on line 134 is the count over routine 198. The count over routine is an interrupt driven routine responsive to the internal counter zero overflow interrupt. At the beginning of every 10 millisecond interval, the background routine sets an internal zero counter to count a predetermined number of base counts which represent the quiescent meter state. At the beginning of every 10 millisecond interval, the zero counter is set to count the number of base counts. After the base counts have been counted, the number of pulses on line 134 needed to make one watt is determined. A flag is set when one watt is reached. This flag is checked in background, whereupon the watt is added to the binary-coded digits already in the memory. For every watt hour counted, a flag is set to update the display.

Figure 10:
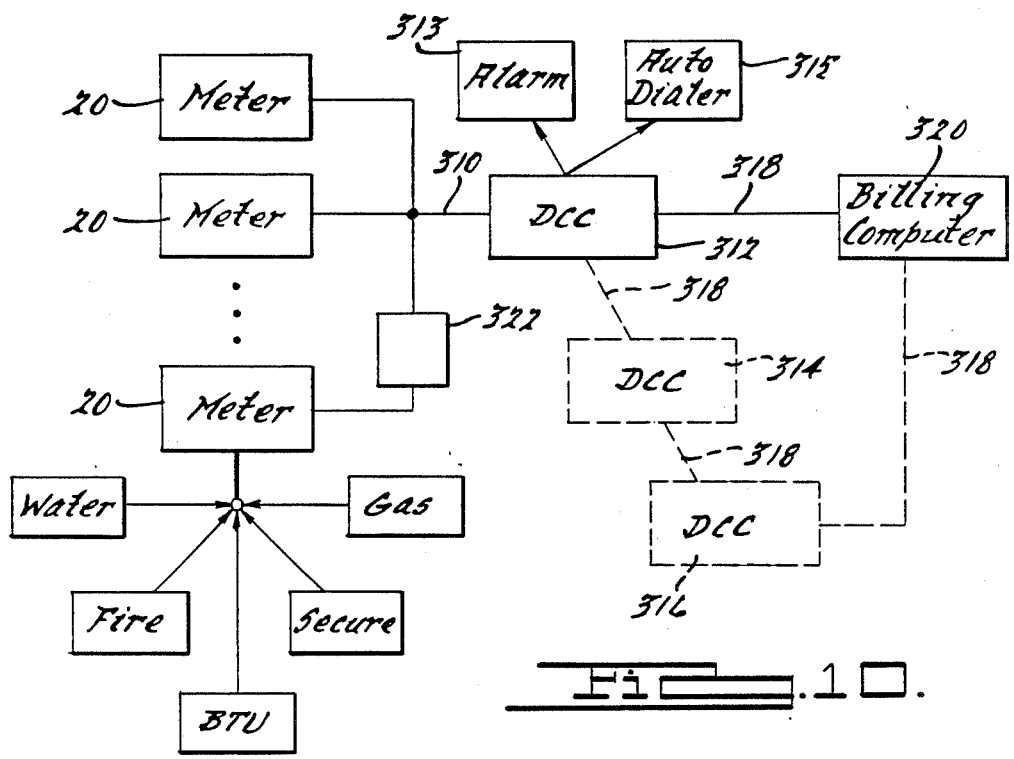
FIG. 10 is a block diagram of the submetering system of the invention.

Referring now to FIG. 10, the submetering system will now be described. The submetering system allows a multiplicity of individual utility meters to communicate with the billing computer through one or more data collection computers using a star cluster network. To illustrate this, FIG. 10 depicts a multiplicity of meters 20, each preferably constructed in accordance with the foregoing. In addition to sensing electric utility consumption, each of the meters can be configured to meter other utilities, such as water, gas, heat and the like. In addition, meters 20 can also be configured to monitor emergency conditions, such as fire, smoke and security (e.g. intrusion into a protected space). These additional utilities and conditions are diagrammatically depicted in FIG. 10. Each of the meters communicates through a serial communication link 310 with a data collection computer 312. The data collection computer in turn communicates through a data transmission link or network 318 with a billing computer 320. If desired, other similar data collection computers, such as data collection computers 314 and 316, can be added to the network 318. Each of these additional data collection computers can be coupled through a similar communication link (not shown) to additional utility meters (not shown). Where long communication links are required, data repeater units 322 can be installed in the communication link 310 to boost signals.

Figure 11:
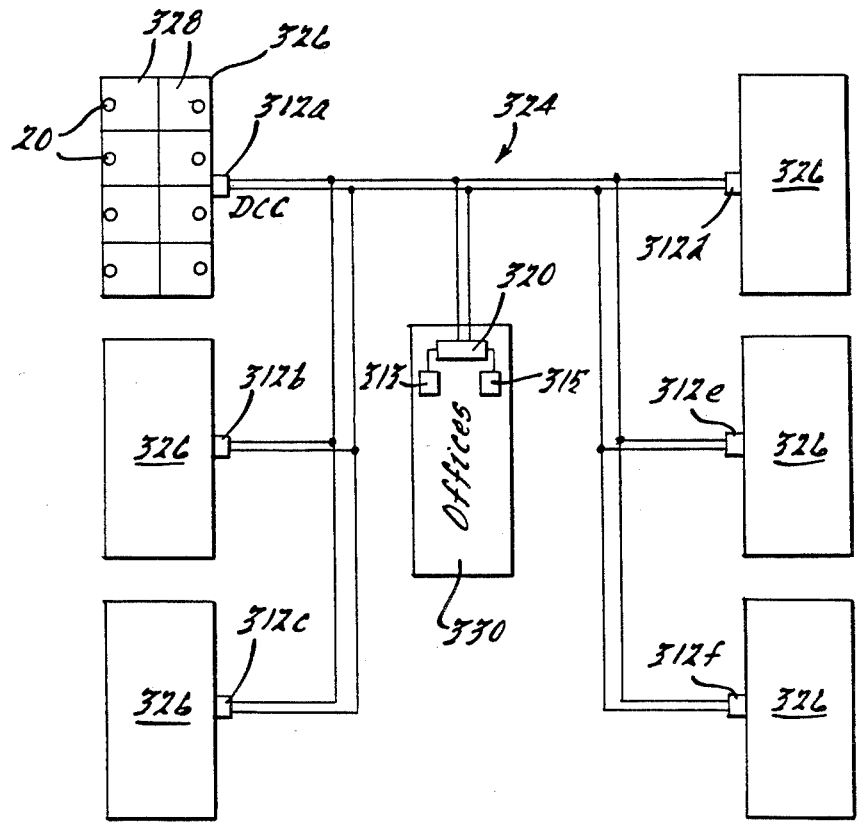
FIG. 11 is a schematic diagram illustrating the submetering system in an exemplary application.

FIG. 11 illustrates the submetering system in a typical application in an apartment complex. The apartment complex 324 comprises a plurality of multiple dwelling units 26, each comprising a plurality of individual apartments 328. Each apartment has its own meter 20 and each multiple dwelling unit has its own data collection computer (numbered 312a through 312f). The apartment complex includes a manager's office 330 in which the central billing computer 320 may be situated. Either the data collection computer or the billing computer can be connected to an alarm device 313 or to an auto dialer 315 for providing an audible alarm or for placing an alerting phone call in the event of trouble. If desired, the billing computer can be a microcomputer, such as an IBM Personal Computer or compatible. Thus, when the central billing computer is not in use as a billing computer, it may be used to perform other office tasks, such as word processing, producing form letters and maintenance reports, and accounting.

Figure 12:
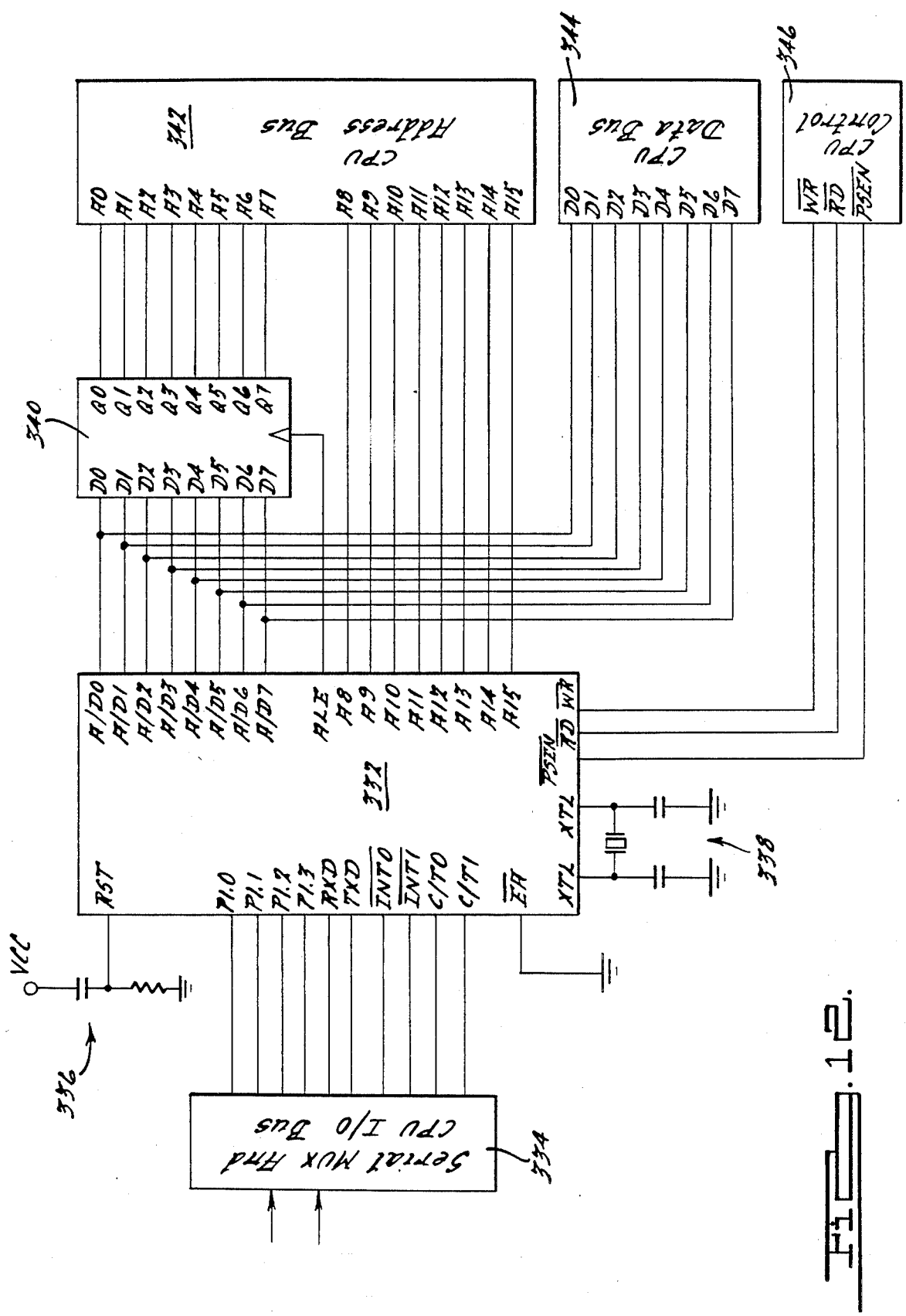
FIG. 12 is a schematic diagram of the processor circuit of the data collection computer of the invention.

The individual meters having been fully described above, the presently preferred data collection computer will now be described. Reference may be had to FIGS. 12 through 17 which depict the electronic circuits of the data collection computer. Referring first to FIG. 12, the data collection computer comprises a microcontroller or microprocessor 332. In the presently preferred embodiment, microcontroller 332 may be implemented using an Intel 8051, 8032, 8052 or the like. For convenience, microcontroller 332 has been labeled with the customary pin designations. Coupled to ports P1.0, P1.1, P1.2, P1.3 and to ports RXD and TXD and the other designated control lines is a serial multiplex and I/O circuit 334. The serial multiplex circuit connects and establishes communication between microcontroller 332 and the individual meters 20 and central billing computer. Serial multiplex circuit 334 is illustrated more completely in FIG. 17, discussed below.

The reset terminal RST of microcontroller 332 is coupled to a resistor capacitor reset circuit 336, which is in turn coupled to the VCC supply and ground as illustrated. Upon power up, the current drawn by the reset terminal commences to charge the capacitor of circuit 336. The voltage at the reset terminal is the difference between VCC and the capacitor voltage. This voltage decreases as the capacitor charges. By selecting a sufficiently large capacitor value, the reset terminal remains high for at least two machine cycles of the microcontroller 332. The microcontroller 332 is internally programmed to execute an internal reset under these conditions.

Microcontroller 332 is provided with the usual external crystal timing components 338. The EA terminal is connected to ground in order to force the CPU of the microcontroller 332 to execute program instructions out of external memory regardless of the program counter value. The address/data terminals A/D-0–A/D7 are coupled to a latch circuit 340, such as a 74LS373 integrated circuit which is enabled by the address latch enable terminal ALE of microcontroller 332. The output of latch 340 comprises the least significant bits (LSB) of the 16-bit address word. Together with the remaining address lines (A8–A15), the output of latch 340 provides the address bus 342. The data bus 344 is derived from the input leads to latch 340 (i.e. microcontroller terminals D0–D7). The address latch enable signal on the ALE terminal provides the logic signal to indicate whether the information input to latch 340 is address information or data information.

Microcontroller 332 also includes a terminal designated PSEN which provides the read strobe for external memory fetches. When the CPU of microcontroller 332 is accessing external program memory, the PSEN terminal is activated. Microcontroller 332 also includes a memory read terminal RD and a memory write terminal WR. These three terminals together comprise the control bus 346 of the data collection computer. The address bus 342, data bus 344 and control bus 346 comprise the primary interconnection between the electronic circuits of the data collection computer. Accordingly, these three buses are reproduced in many of the remaining Figures.

Figure 13:
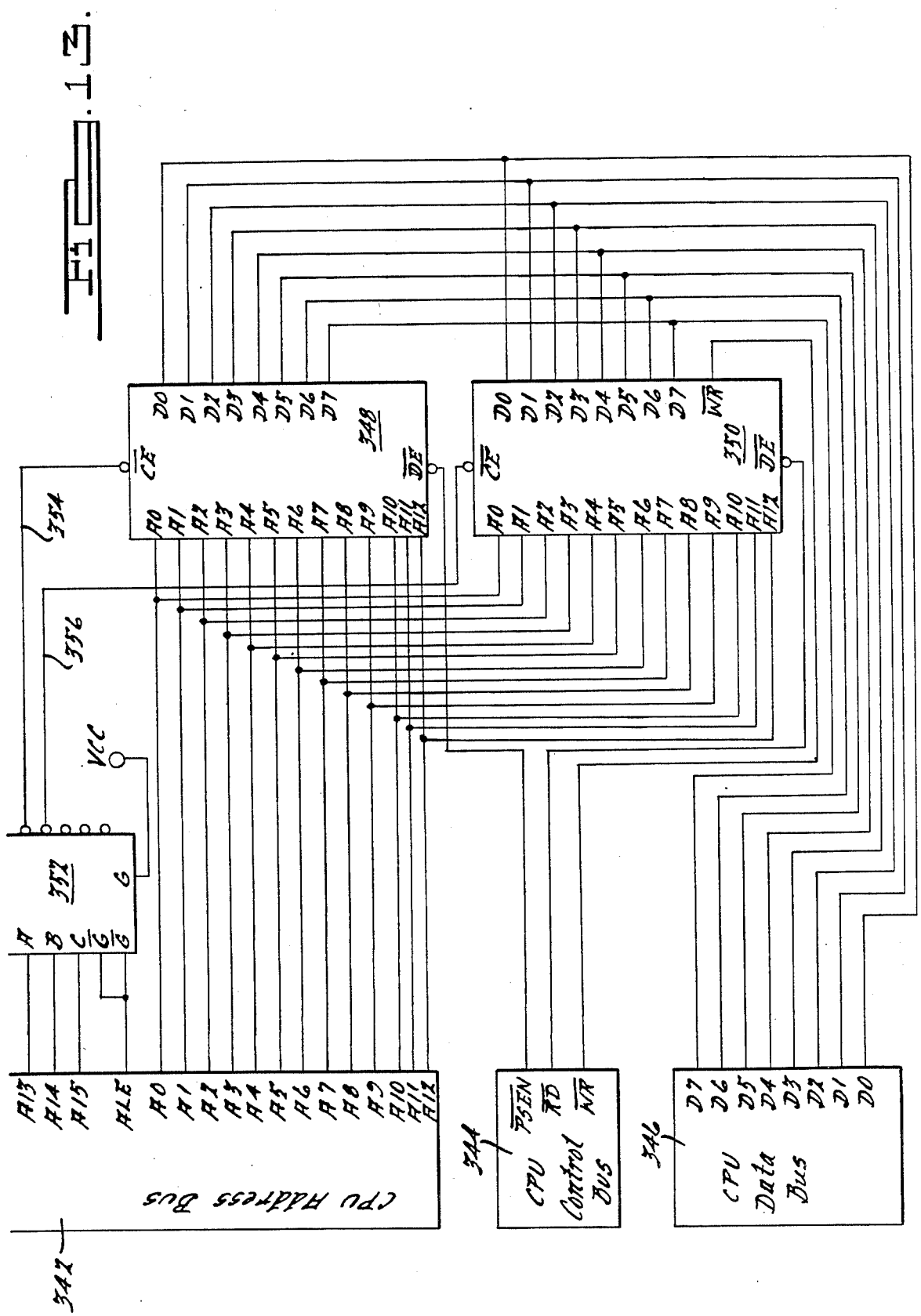
FIG. 13 is a schematic diagram of the bus structure and memory circuits of the data collection computer of the invention.

Referring now to FIG. 13, the external memory circuits of the data collection computer are illustrated. Presently two such memory circuits are employed, ROM 348 and RAM 350. As illustrated, ROM memory circuit 348 has a memory read terminal DE which is coupled to the PSEN terminal of control bus 344. Activating the PSEN line allows the microcontroller to fetch program instructions from the ROM memory circuit via the data bus 346. RAM memory circuit 350 has a memory read terminal DE coupled to the RD terminal of control bus 346. RAM 350 has a memory write terminal WR coupled to the WR terminal of control bus 346. These terminals are activated to read and write data to the RAM circuit.

Address lines A0 through A10 are used to address individual memory storage locations within both memory circuits 348 and 350. In order to select which of the two memory circuits is to be addressed, the most significant address bits A13 through A15 are employed. These most significant bit address lines are coupled to the A, B, C and NOT G terminals of demultiplexing circuit 352. Circuit 352 interprets the incoming address lines as binary-weighted inputs and provides a pair of outputs 354 and 356 which are coupled to the chip-enable terminals CE of memory circuits 348 and 350, respectively. Circuit 352 interprets the state of the most significant address bits A13–A15 and selectively activates and/or deactivates the memory circuits. ROM memory circuit 348 is used to store program instructions for operating the data collection computer and RAM memory circuit 350 is used to store utility usage readings taken from the utility meters 20 during operation of the data collection computer. The internal RAM of microcontroller 332 can also be used to store utility usage readings.

Figure 14:
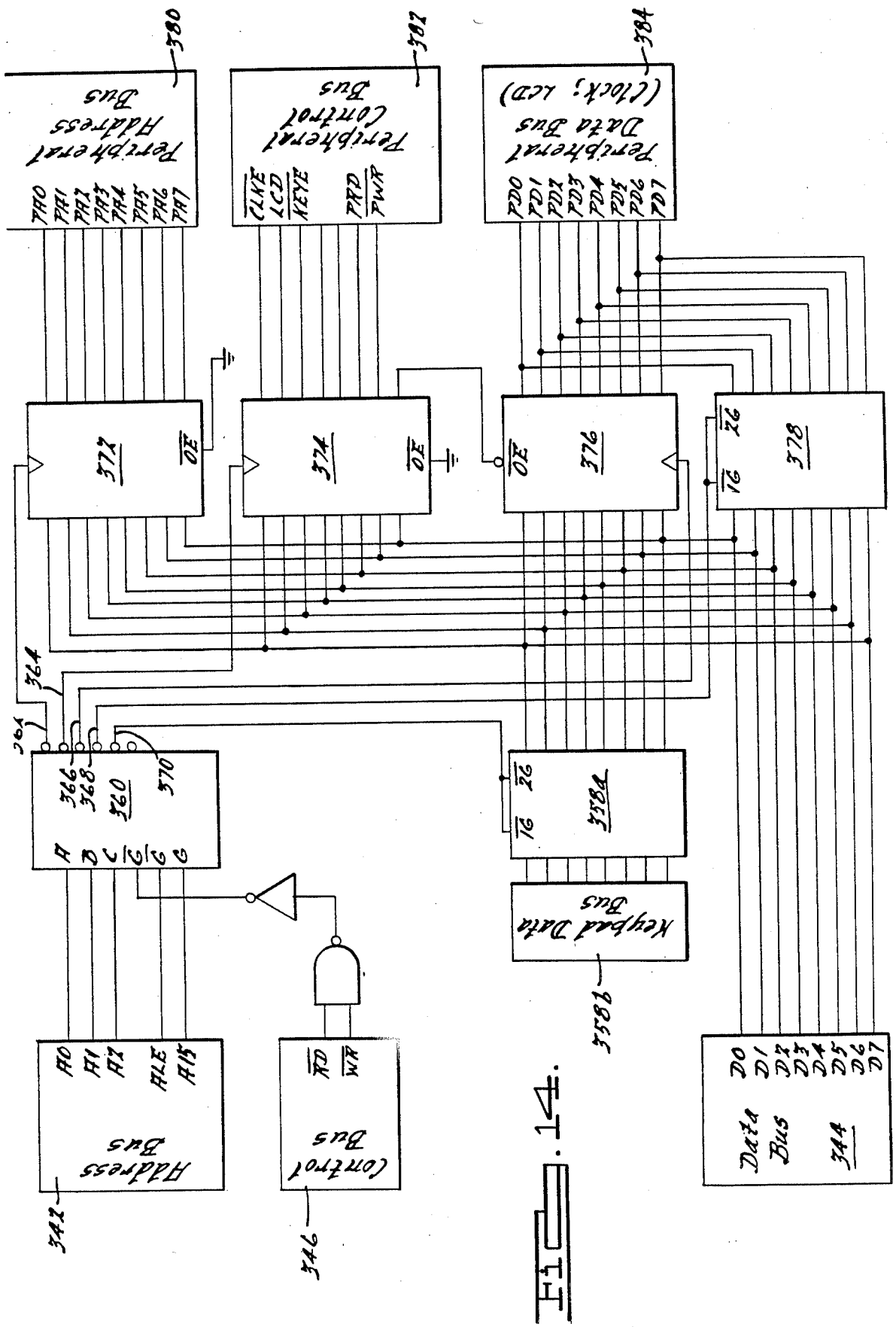
FIG. 14 is a schematic diagram of additional circuits of the data collection computer of the invention.

Referring now to FIG. 14, the data collection computer further includes a peripheral bus structure, including peripheral address bus 380, peripheral control bus 382 and peripheral data bus 384. In general, the peripheral control bus structure is used to establish communication between the microcontroller, which operates at a comparatively high speed, and slower peripheral devices, including the keypad, the liquid crystal display (LCD), the time and date clock circuit, an optional modem circuit, and so forth. These peripheral devices communicate with the microcontroller using a memory mapped input/output strategy.

In the illustrated embodiment, address line A15 of CPU address bus 342 is coupled to the G enable terminal of demultiplexing circuit 360, which establishes the address of the peripheral devices as beginning at 8,000 hex. In other words, addresses below 8,000 hex are treated as memory addresses and addresses above 8,000 hex are treated as peripheral device addresses. While the port decode of 8,000 hex is illustrated and described herein, it will be understood that the peripheral devices can be mapped to some other starting address, and the choice of 8,000 hex should not be construed as a limitation of the invention.

Circuit 360 may be implemented using a 74LS138 integrated circuit. Demultiplexing circuit 360, when enabled by activation of address line A15, interprets address terminals A0–A2 as binary-weighted inputs for selecting one of a plurality of outputs 362, 364, 366, 368 and 370, each corresponding to one of the peripheral devices.

Output 370 is coupled to the keypad circuit 358 including bus buffer circuit 358a as illustrated. Keypad circuit 358 is the peripheral device through which instructions, requests for information, and the like can be manually input. The keypad circuit is shown more fully in connection with FIG. 15 discussed below. Keypad circuit 358 is coupled to address bus 342 through demultiplexing circuit 360 and to the CPU data bus 344 keypad circuit also provides a keypad data bus 358b as illustrated.

The remaining outputs 362–368 are in turn coupled to the enable terminals of latch circuits 372, 374 and 376, and to the control input terminals 1G and 2G of buffer circuit 378. In accordance with the input supplied to demultiplexing circuit 360, latches 372–376 and buffer 378 are activated or enabled.

Latches 372–376 have inputs coupled to CPU data bus 44 and have outputs respectively coupled to the peripheral address bus 380, to the peripheral control bus 382 and to the peripheral data bus 384. Similarly, the inputs of buffer 378 are coupled to the CPU data bus 384 and the outputs of buffer 378 are coupled to data bus 344. When enabled by the appropriate signal from demultiplexing circuit 360, the latches read the data bus input and latch and store that input for output to the associated peripheral address bus, peripheral control bus or peripheral data bus. Buffer 378 is preferably a tristate buffer device which presents a high impedance state when the control inputs are high. When the control inputs are low, the peripheral data bus is coupled to the data bus 344 of microcontroller 342.

Figure 15:
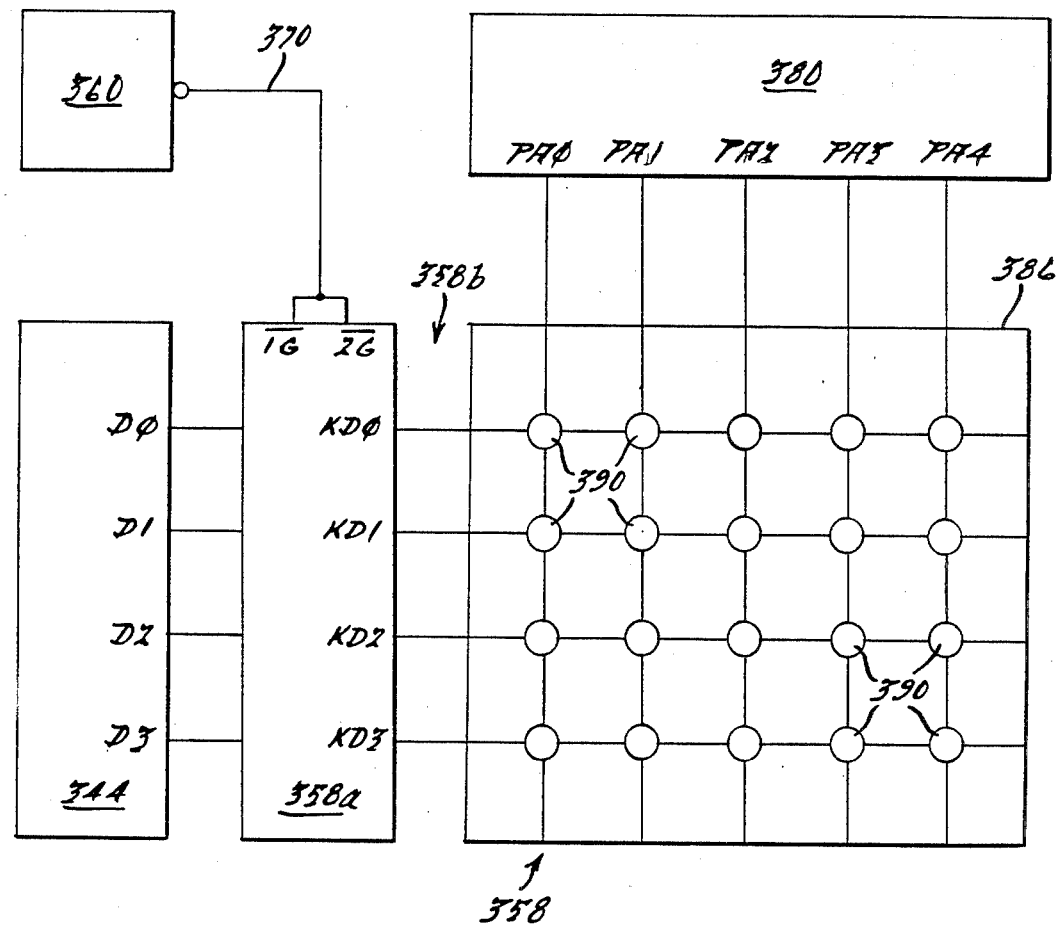
FIG. 15 is a schematic diagram of the keypad entry circuits of the data collection computer of the invention.

Keypad circuit 358 is illustrated more fully in FIG. 15. The keypad circuit includes a keypad matrix 386 which has its vertical terminals coupled to peripheral address bus 380 terminals PA0, PA1, PA2 and PA3. The horizontal inputs of matrix 386 are coupled to buffer circuit 358a, which is in turn coupled to CPU data bus 344. Although a 4×5 matrix 386 has been illustrated, the size of the matrix can be larger or smaller, depending on the number of key functions being implemented. Buffer 358a may be implemented using a 74LS244 integrated circuit. The control inputs 1G and 2G of buffer 358a are connected to output 370 of demultiplexing circuit 360 (as also shown in FIG. 14). Each of the intersections 390 of the horizontal and vertical leads of matrix 386 represents a switch which couples the corresponding peripheral address line to the corresponding data bus line when manually depressed.

Figure 16:
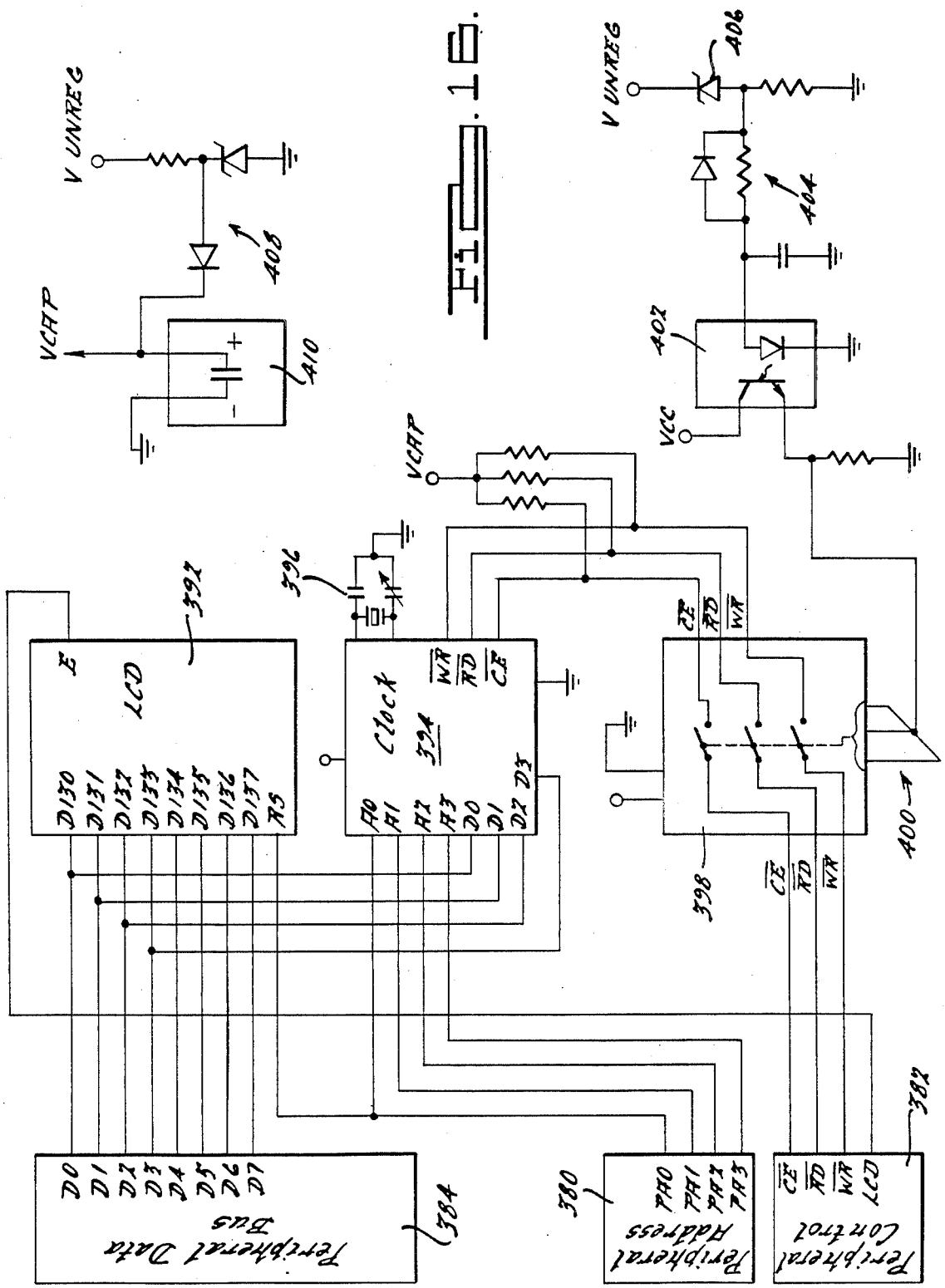
FIG. 16 is a schematic diagram of additional circuits of the data collection computer of the invention.

In order to provide a visual indication of the operation of the data collection computer, a liquid crystal display 392 is provided as illustrated in FIG. 16. Liquid crystal display 392 is coupled to peripheral data bus 384 and is enabled by the LCD line of peripheral control bus 382.

In order to provide the capability of recording time of use information, and in order to determine when peak utility demand has occurred, the data collection computer includes a digital clock circuit 394 which is controlled by an external crystal 396. Clock 394 is coupled to lines D0–D3 of peripheral data bus 384 and also to address lines PA0–PA3 of peripheral address bus 380. The clock circuit is further coupled to the peripheral control bus 382 through a switching circuit 398 comprising three individual electronically controlled switches, one for the chip-enable terminal CE, one for the read terminal RD and one for the write terminal WR. These electronically controlled switches are gated by applying a control voltage to the control terminals 400. As illustrated, the control terminals 400 are tied together and coupled to the output of optoisolator 402. The input of optoisolator 402 is in turn connected to a resistor diode network 404, including Zener diode 406 used to sense the unregulated voltage derived from the AC power line. Fluctuation in this unregulated voltage provides a measure of brownout conditions as well as momentary power line dropout. When the unregulated voltage drops, the output of optoisolator 402 goes low, causing the switches internal to switching circuit 398 to open. In this fashion, the clock circuit 394 can be write protected or decoupled from the peripheral control bus 382 during brownouts or power dropouts, in order to prevent spurious microcontroller signals from causing false time and date readings. If desired, switching circuit 398 can be replaced with a manually operated switch.

To provide the clock with a stable reference voltage, a regulator circuit 408, including precision capacitor 410 is provided. If desired, the output VCAP of regulator circuit 408 can also be coupled to the switching circuit 398.

Figure 17:
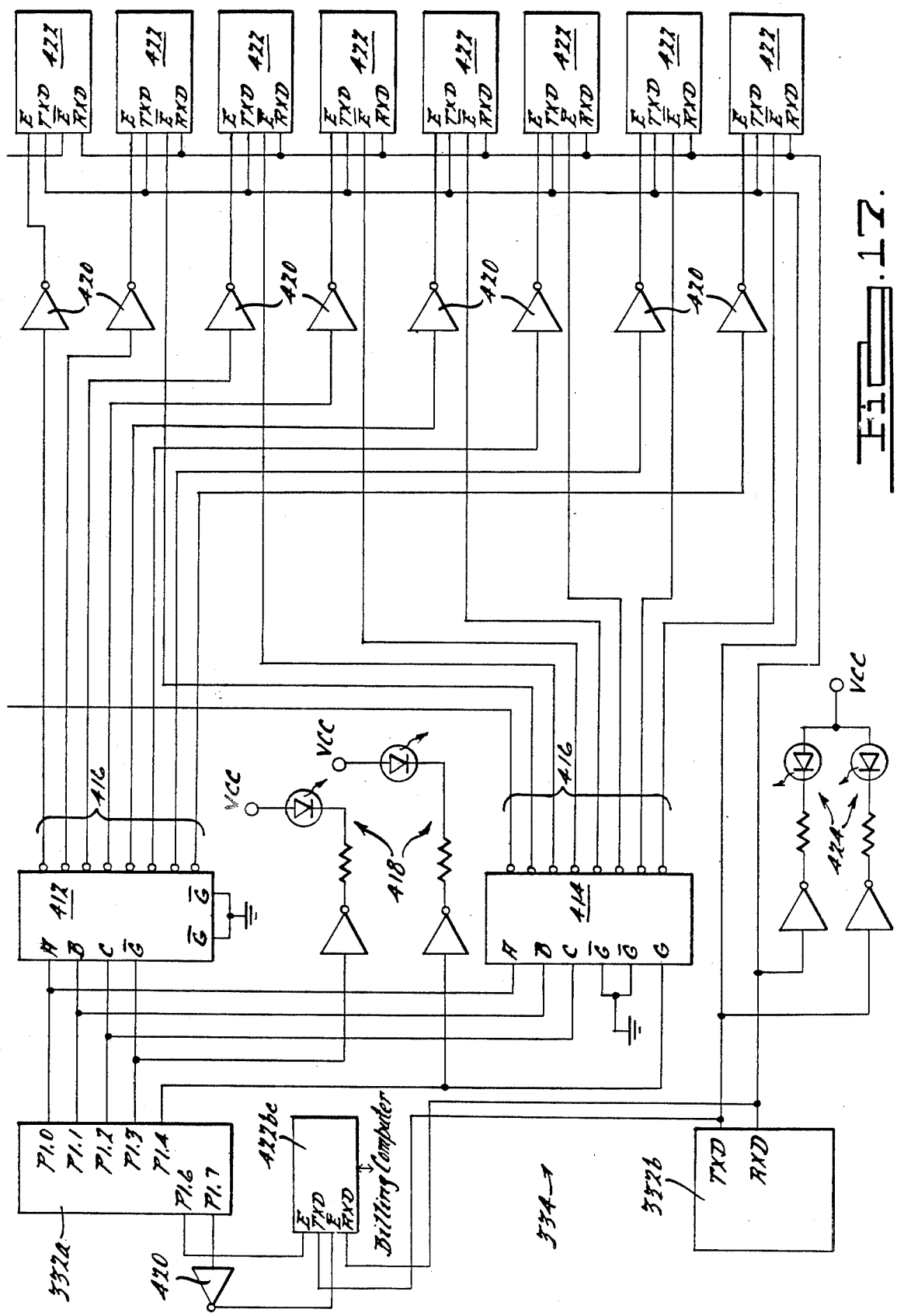
FIG. 17 is a schematic diagram of the serial multiplexing circuits of the data collection computer of the invention.

Referring now to FIG. 17, serial multiplexing circuit 334 is shown in greater detail. For illustration purposes, ports P1.0–P1.7 and serial terminals RXD and TXD of microcontroller 332 have been separately illustrated in FIG. 7 and have been given reference numerals 332a and 332b. Ports P1.0–P1.2 are coupled to the A, B and C inputs of demultiplexing circuit 412. One of the enable inputs G is coupled to port P1.3, with the remaining enable inputs being grounded. In a similar fashion, a second demultiplexing circuit 414 is coupled to ports P1.0–P1.2, with the G enable input being coupled to port P1.4. Demultiplexing circuits 412 and 414 may be implemented using 74LS138 integrated circuits. Both circuits operate in a similar fashion. When the enable input G is activated, the state at inputs A, B and C is interpreted as a binary-weighted value. Depending upon the value, one of the outputs 416 is activated. Thus, by enabling port P1.3 or P1.4, the corresponding demultiplexing circuit 412 or 414 can be selected. To provide a visual indication of which circuit has been selected, a pair of indicator circuits 418 are included. The indicator circuits are coupled to ports P1.3 and P1.4 and thus give an indication of when the demultiplexing circuits are enabled or disabled.

As illustrated, the outputs of demultiplexing circuit 412 are coupled through inverters 420 to the E terminals of RS42 transceiver circuits 422. The outputs of second demultiplexing circuit 414 are coupled without inverters directly to the NOT E terminals of transceiver circuits 422. The TXD and RXD of microcontroller 322 (322b) are coupled directly to the TXD and RXD terminals of the transceiver circuits 422. To provide a visual indication when serial transmission or reception is taking place, a second pair of indicator circuits 424 are coupled to the TXD and RXD lines as illustrated. The transceiver circuits 422 implement a type of party line in which each of the transceiver circuits shares a common data communication channel. In order to arbitrate date through this channel and to avoid data conflicts, the E and NOT E terminals of the transceiver circuits are used to receive enable signals, one serving to enable the transmit mode and the other to enable the receive mode. The enable signals are ultimately provided by the microcontroller which in turn ensures that only one transceiver is sending information at a time. Several transceivers could, of course, receive information at the same time if desired.

Referring now to FIG. 19, the optional modem circuit is illustrated. The modem circuit comprises a modem integrated circuit 600, such as a 74HC943 integrated circuit. A transformer 602 is used to couple between the modem circuit 600 and the outside phone lines 604. As illustrated, the transformer 602 is capacitively coupled to the RXA1 terminal of modem circuit 600. A 600 ohm termination resistance 606 is also coupled to this terminal, as illustrated. The modem circuit 600 provides a plurality of computer communication lines 608 which communicate with microcontroller 332. The modem circuit gives the data collection computer the ability to communicate over commercial phone lines.

As previously stated, the submetering system of the invention employs a star cluster network. In the presently preferred embodiment, twelve individual utility meters, each having its own unique identification device number, define a cluster having its own unique cluster number. In the presently preferred embodiment, each data collection computer communicates with eight such clusters. To communicate with the central billing computer another transceiver circuit 422bc is provided. If desired, a plurality of data collection computers can communicate with a single central billing computer.

The data collection computer is preprogrammed to permit communication with each of the individual meters in its associated clusters and with the central billing computer. The program instructions for providing these functions is stored in the computers program memory or read only memory. FIGS. 18a through 18m describe the program algorithms. Referring to FIGS. 18a through 18m, it will be understood that the program steps of FIG. 18a are followed by the program steps of FIG. 18b, as indicated by the flow chart connection points, the circles labeled "A". Throughout the flow charts of FIGS. 18a through 18m, circles with like letters are used to designate flow chart connection points or branch points, as will be understood by those skilled in the art.

Referring now to FIG. 18a, the various power up initializing steps are set forth. In step 500, the internal timer of microcontroller 332 is initialized. This timer is used to control the communication baud rate. In step 502, the liquid crystal display is initialized. The liquid crystal display is preferably of a programmable variety, having different column widths, lines, and so forth. The initialization step sets the liquid crystal display to the desired operating parameters. In step 504, the serial communication port is initialized for communication at the desired baud rate. The Real Time/Date clock is initialized in step 506. As previously stated, one of the transceivers (422bc) is used to communicate with the central billing computer. Step 508 sets that serial port in the listen mode, to ready it to receive commands from the central billing computer. Finally, in step 510, a sign on message is displayed. If desired, the user can be prompted to enter a password at this point.

Control continues with step 512 in FIG. 18b. Essentially, the routines set forth in FIG. 18b, handle communication between the central billing computer and the data collection computer. As will be more fully explained below, the remaining program steps of FIGS. 18c through 18m relate to communication between the human operator and the data collection computer via the keypad. The transition between the routines of 18b and those of the remaining FIGS. 18c through 18m is at step 512. In step 512, the microcontroller determines whether a key has been pressed on the keypad. If it has, control branches to step 526, and if not, control continues with step 514. Step 514 tests to see whether a serial character has been received from the billing computer. If so, control proceeds to step 516 where the data collection computer determines whether the message issuing from the billing computer has that data collection computer's characteristic address number. Each of the data collection computers is assigned a unique address number, and this number is used by the billing computer to signify which data collection computer should respond.

In its presently preferred form, the billing computer can issue a read command to the data collection computer. At step 518, the receive command is tested to see if it is a read command. If so, control continues in steps 520 through 524 to instruct the selected meter to send its current meter reading value (e.g. the kilowatt hour value) and the data collection computer relays that value to the billing computer. If desired, the billing computer and data collection computer can be programmed to handle other commands as well. If so, step 518 would serve as a convenient branch point for implementing other command routines.

Assuming a key has been pressed on the keypad, step 512 transfers control to steps 526 through 546. These steps are executed in sequence and determine which of the keys has been pressed and consequently which subroutine or procedure should next be executed. In the presently preferred embodiment, the keypad comprises a plurality of dedicated function keys which are used by the human operator to enter specific commands to the data collection computer. Steps 526 through 538 each correspond to one of these function keys. Some of the function keys have dual purposes or secondary purposes. Thus a separate "Function" key is provided to shift a key's purpose from its primary function to its secondary function. Step 540 corresponds to the depressing of this special "Function" key. Steps 544 and 546 correspond to secondary functions.

With the foregoing understanding, a brief description of each of the functions will now be given. One function is the Loop K.W.H. function which is decoded at step 526. The Loop K.W.H. function is set forth in FIG. 18e. Basically, this function causes a particular meter to be read, and its kilowatt hour value continuously displayed with periodic updates.

The Read K.W.H. function is implemented in the steps of FIG. 18f. Basically, this function reads a particular meter and displays its present value on the liquid crystal display. Unlike the Loop function, the Read function does not continually update the value displayed.

Also provided is a K.W.H. All function. This function is implemented in the steps of FIG. 18g. This function causes the data collection computer to sequentially interrogate each of the meters connected to it and to display its current meter reading value. Preferably, a several second pause occurs between each meter reading, to give the human operator time to read the value.

Since some of the above functions interrogate a particular meter, the data collection computer must be capable of receiving human instruction of which meter is to be read. This is entered using the Cluster and Device functions. It will be recalled that each Cluster on a given data collection computer has a unique Cluster number and each device within a given Cluster also has a unique Device number. Thus by specifying both Cluster number and Device number, a particular meter can be selected. The current Cluster number is stored in a memory location or variable in data memory designated as [CLUSTER], and the Device number is stored in a similar fashion under the designation [DEVICE]. The steps of FIGS. 18h and 18i are used to input and update the [CLUSTER] and [DEVICE] variables.

If the operator wishes to read a meter different from the meter previously read, the Read Once function can be used. This function is set forth in the steps of FIG. 18j, and basically performs the steps necessary to set the desired Cluster and Device number prior to reading the meter and displaying its value. Thus, the Read Once function performs, in a fewer number of keystrokes, the Set Cluster, Set Device and Read K.W.H. steps.

From time to time the user may wish to check the current time and date being maintained by the clock 394. The Time/Date function does this. The Time/Date function is illustrated in the steps of 18k. If, for some reason, the date and time needs to be changed, such as following a power failure or biannually to and from daylight savings time, the Set Time and Set Date functions are provided. As seen in FIG. 18d, the Set Time and Set Date functions are secondary functions of two of the other function keys. Hence, the "Function" key must be depressed before selecting the Set Time or Set Date functions. These routines are performed using the steps of FIGS. 18l and 18m.

While the invention has been described in its presently preferred embodiment, it will be understood that the invention is capable of certain modification and change without departing from the spirit of the invention as set forth in the following claims.

What is claimed as novel is as follows:

1. A utility metering system for metering a multiplicity of utility users comprising:
   a plurality of utility metering devices responsive to the utility consumption of said utility users and providing utility data signals indicative of said consumption;
   at least one data collection computer having data input/output means for communicating with said metering devices and for collecting said utility data signals;
   a billing computer having means for communicating with said data collection computer and for receiving said collected utility data signals from said data collection computer; and
   wherein said data input/output means includes a serial data channel for transmitting and receiving data, a serial multiplexing means coupled to said serial data channel, a plurality of transceiver means each for communicating with a different one of said utility metering devices and coupled to said serial data channel, and processor means for controlling said plurality of transceiver means, said processor means being preprogrammed to selectively enable a single transceiver means for transmitting data from said data channel to a utility metering device and said processor means being preprogrammed to selectively enable a plurality of transceiver means for receiving on said data channel data from a plurality of utility metering devices, whereby said data input/output means ensures that only one transceiver means is enabled for transmitting at a time while permitting a plurality of transceiver means to be enabled for receiving at a time.

2. The utility metering system of claim 1 wherein at least one of said metering devices includes means for sensing a plurality of different types of utilities.

3. The utility metering system of claim 1 wherein at least one of said metering devices includes means for sensing electric utility consumption.

4. The utility metering system of claim 1 wherein at least one of said metering devices includes means for sensing gas utility consumption.

5. The utility metering system of claim 1 wherein at least one of said metering devices includes means for sensing water utility consumption.

6. The utility metering system of claim 1 wherein at least one of said metering devices includes means for sensing fire.

7. The utility metering system of claim 1 wherein at least one of said metering devices includes means for detecting intrusion into a protected space.

8. The utility metering system of claim 1 wherein said utility data signals are serial digital signals.

9. The utility metering system of claim 1 wherein said data collection computer includes a telephone dialer and a communication means for placing a telephone call in response to predetermined data signals.

10. The utility metering system of claim 1 wherein said data collection computer includes nonvolatile memory for storing said utility data signals.

* * * * *

UNITED STATES PATENT AND TRADEMARK OFFICE
CERTIFICATE OF CORRECTION

PATENT NO. : 4,804,957

DATED : February 14, 1989

INVENTOR(S) : Marvin P. Selph et al.

It is certified that error appears in the above-identified patent and that said Letters Patent is hereby corrected as shown below:

On the title page, item [57] ABSTRACT
   line 8, delete "microprocess" and "or" and insert therefor
-- microprocessor --.

Column 7, line 67, delete "!14" and insert therefor -- 114 --.

Column 10, line 7, delete "38" and insert therefor -- 138 --.

Column 13, line 35, delete "26" and insert therefor -- 326 --.

Column 15, line 59, delete "44" and insert therefor -- 344 --.

Signed and Sealed this

Twenty-ninth Day of May, 1990

Attest:

HARRY F. MANBECK, JR.

*Attesting Officer*  *Commissioner of Patents and Trademarks*